(12) United States Patent
Sankaranarayanan et al.

(10) Patent No.: US 12,308,875 B2
(45) Date of Patent: May 20, 2025

(54) RECONFIGURABLE AMPLIFIER

(71) Applicant: QUALCOMM Incorporated, San Diego, CA (US)

(72) Inventors: Janakiram Sankaranarayanan, San Diego, CA (US); Jun Tan, San Diego, CA (US); Lai Kan Leung, Carlsbad, CA (US); Timothy Donald Gathman, San Diego, CA (US); Mehmet Ipek, Dallas, TX (US); Ojas Choksi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/667,309

(22) Filed: May 17, 2024

(65) Prior Publication Data

US 2024/0305327 A1   Sep. 12, 2024

Related U.S. Application Data

(62) Division of application No. 18/317,011, filed on May 12, 2023, now Pat. No. 12,009,850, which is a
(Continued)

(51) Int. Cl.
H04B 1/18 (2006.01)
H03F 3/19 (2006.01)

(52) U.S. Cl.
CPC .............. *H04B 1/18* (2013.01); *H03F 3/19* (2013.01); *H03F 2200/294* (2013.01); *H03F 2200/451* (2013.01)

(58) Field of Classification Search
CPC ...... H03F 1/0211; H03F 1/0261; H03F 1/223; H03F 2200/129; H03F 2200/144; H03F 2200/147; H03F 2200/294; H03F 2200/42; H03F 2200/451; H03F 2200/48; H03F 2200/511; H03F 2200/519; H03F 2203/30084; H03F 2203/30117;
(Continued)

(56) References Cited

U.S. PATENT DOCUMENTS 10,938,349 B1   3/2021   Ayranci et al.
11,196,431 B1  12/2021   Lin
(Continued)

OTHER PUBLICATIONS

International Search Report and Written Opinion—PCT/US2022/038178—ISA/EPO—Nov. 17, 2022.

*Primary Examiner* — Nguyen T Vo
(74) *Attorney, Agent, or Firm* — QUALCOMM Incorporated

(57) ABSTRACT

An amplifying circuit includes a first reconfigurable amplifier configured to selectively operate in a cascode mode or a non-cascode mode, wherein an input of the first reconfigurable amplifier is coupled to a first input of the amplifying circuit, and an output of the first reconfigurable amplifier is coupled to an output of the amplifying circuit. The amplifying circuit also includes a second reconfigurable amplifier configured to selectively operate in the cascode mode or the non-cascode mode, wherein an input of the second reconfigurable amplifier is coupled to a second input of the amplifying circuit, and an output of the second reconfigurable amplifier is coupled to the output of the amplifying circuit.

11 Claims, 15 Drawing Sheets

Related U.S. Application Data division of application No. 17/404,948, filed on Aug. 17, 2021, now Pat. No. 11,683,062.

(58) Field of Classification Search
CPC .... H03F 2203/7227; H03F 3/19; H03F 3/195; H03F 3/3022; H03F 3/72; H04B 1/18
See application file for complete search history.

(56) References Cited

U.S. PATENT DOCUMENTS

| | | | |
|---|---|---|---|
| 11,683,062 B2 | 6/2023 | Sankaranarayanan et al. | |
| 2007/0222515 A1* | 9/2007 | Koutani | H03F 1/223 |
| | | | 257/E29.12 |
| 2014/0139288 A1 | 5/2014 | Cha et al. | |
| 2014/0348274 A1* | 11/2014 | Youssef | H03G 1/0023 |
| | | | 375/345 |
| 2016/0036392 A1 | 2/2016 | Bohsali et al. | |
| 2016/0142231 A1* | 5/2016 | Rajendran | H03F 3/68 |
| | | | 375/340 |
| 2017/0133989 A1 | 5/2017 | Dykstra et al. | |
| 2018/0175805 A1 | 6/2018 | Sayilir et al. | |
| 2018/0278449 A1 | 9/2018 | Kim et al. | |
| 2018/0294774 A1 | 10/2018 | Seshita et al. | |
| 2019/0089309 A1 | 3/2019 | Soliman | |
| 2020/0328724 A1 | 10/2020 | Ayranci et al. | |
| 2023/0057499 A1 | 2/2023 | Sankaranarayanan et al. | |
| 2023/0283312 A1 | 9/2023 | Sankaranarayanan et al. | |

\* cited by examiner

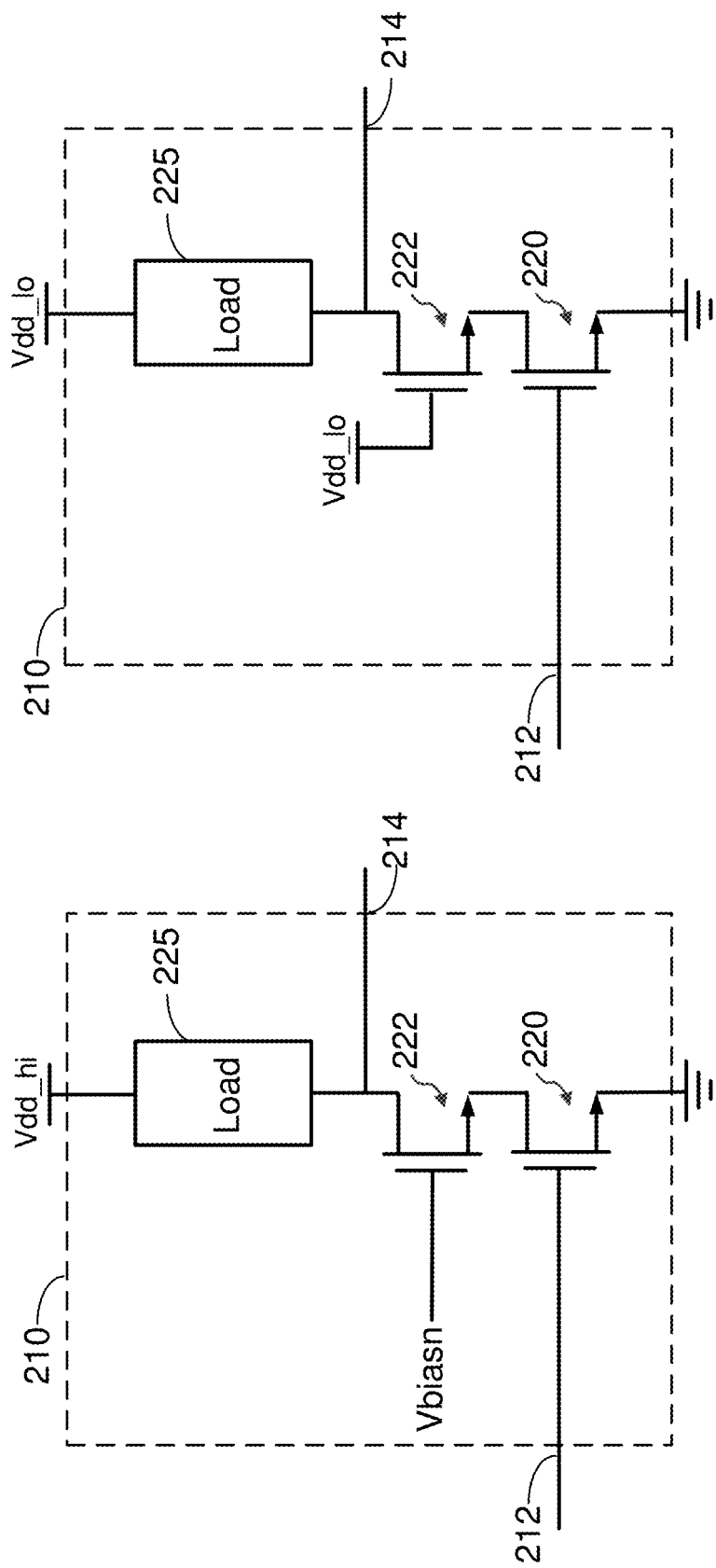

RECONFIGURABLE AMPLIFIER

CROSS-REFERENCE TO RELATED APPLICATIONS

The present divisional application claims priority to and the benefit of U.S. divisional application Ser. No. 18/317,011, filed on May 12, 2023, and U.S. application Ser. No. 17/404,948, filed on Aug. 17, 2021, the entire contents of which are incorporated herein by reference as if fully set forth below in their entireties and for all applicable purposes.

BACKGROUND

Field

Aspects of the present disclosure relate generally to wireless communications, and more particularly, to reconfigurable amplifiers.

Background

Wireless communications systems are widely deployed to provide wireless devices with various types of communication content such as voice, video, packet data, messaging, broadcast, and so on. To support wireless communications, a wireless device includes one or more antennas and a transceiver for receiving and transmitting radio frequency (RF) signals via the one or more antennas. The transceiver typically includes amplifiers on the receiver side for amplifying RF signals received by the one or more antennas.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to an apparatus including a reconfigurable amplifier. The reconfigurable amplifier includes a first transistor having a gate coupled to an input of the reconfigurable amplifier, and a source coupled to a ground. The reconfigurable amplifier also includes a gate control circuit, and a second transistor having a gate coupled to the gate control circuit, a source coupled to a drain of the first transistor, and a drain coupled to an output of the reconfigurable amplifier, wherein the gate control circuit is configured to output a bias voltage to the gate of the second transistor in a cascode mode, and output a switch voltage to the gate of the second transistor in a non-cascode mode. The reconfigurable amplifier further includes a load coupled to the output of the reconfigurable amplifier.

A second aspect relates to an apparatus including an amplifying circuit. The amplifying circuit includes a first reconfigurable amplifier configured to selectively operate in a cascode mode or a non-cascode mode, wherein an input of the first reconfigurable amplifier is coupled to a first input of the amplifying circuit, and an output of the first reconfigurable amplifier is coupled to an output of the amplifying circuit. The amplifying circuit also includes a second reconfigurable amplifier configured to selectively operate in the cascode mode or the non-cascode mode, wherein an input of the second reconfigurable amplifier is coupled to a second input of the amplifying circuit, and an output of the second reconfigurable amplifier is coupled to the output of the amplifying circuit. The apparatus also includes a controller coupled to the first reconfigurable amplifier and the second reconfigurable amplifier, wherein the controller is configured to, in a combining mode, cause the first reconfigurable amplifier to operate in the cascode mode and the second reconfigurable amplifier to operate in the cascode mode, and, in a first multiplexing mode, cause the first reconfigurable amplifier to operate in the non-cascode mode and turn off the second reconfigurable amplifier.

A third aspect relates to a method of amplification using a first reconfigurable amplifier and a second reconfigurable amplifier, wherein each of the first reconfigurable amplifier and the second reconfigurable amplifier is configured to selectively operate in a cascode mode or a non-cascode mode. The method includes, in a combining mode, amplifying a first signal using the first reconfigurable amplifier operating in the cascode mode to obtain an amplified first signal, amplifying a second signal using the second reconfigurable amplifier operating in the cascode mode to obtain an amplified second signal, and combining the amplified first signal and the amplified second signal. The method also includes, in a first multiplexing mode, turning off the second reconfigurable amplifier, and amplifying the first signal using the first reconfigurable amplifier operating in the non-cascode mode to obtain the amplified first signal.

A fourth aspect relates to an apparatus. The apparatus includes a first receive path including a first reconfigurable amplifier configured to selectively operate in a cascode mode or a non-cascode mode, the first receive path having an input configured to receive a first intermediate frequency (IF) signal corresponding to a first radio frequency (RF) signal and a second IF signal corresponding to a second RF signal either simultaneously or individually. The apparatus also includes a second receive path including a second reconfigurable amplifier configured to selectively operate in the cascode mode or the non-cascode mode, the second receive path having an input configured to receive a third IF signal corresponding to the first RF signal and a fourth IF signal corresponding to the second RF signal either simultaneously or individually, wherein the first receive path and the second receive path have a common output. The apparatus also includes a first mixer coupled to the common output, wherein the first mixer is configured to frequency down-convert the first IF signal and the third IF signal. The apparatus further includes a second mixer coupled to the common output, wherein the second mixer is configured to frequency down-convert the second IF signal and the fourth IF signal.

BRIEF DESCRIPTION OF THE DRAWINGS

FIG. 2B illustrates an example of the reconfigurable amplifier of FIG. 2A in a cascode mode according to certain aspects of the present disclosure.

FIG. 2C illustrates an example of the reconfigurable amplifier of FIG. 2A in a non-cascode mode according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
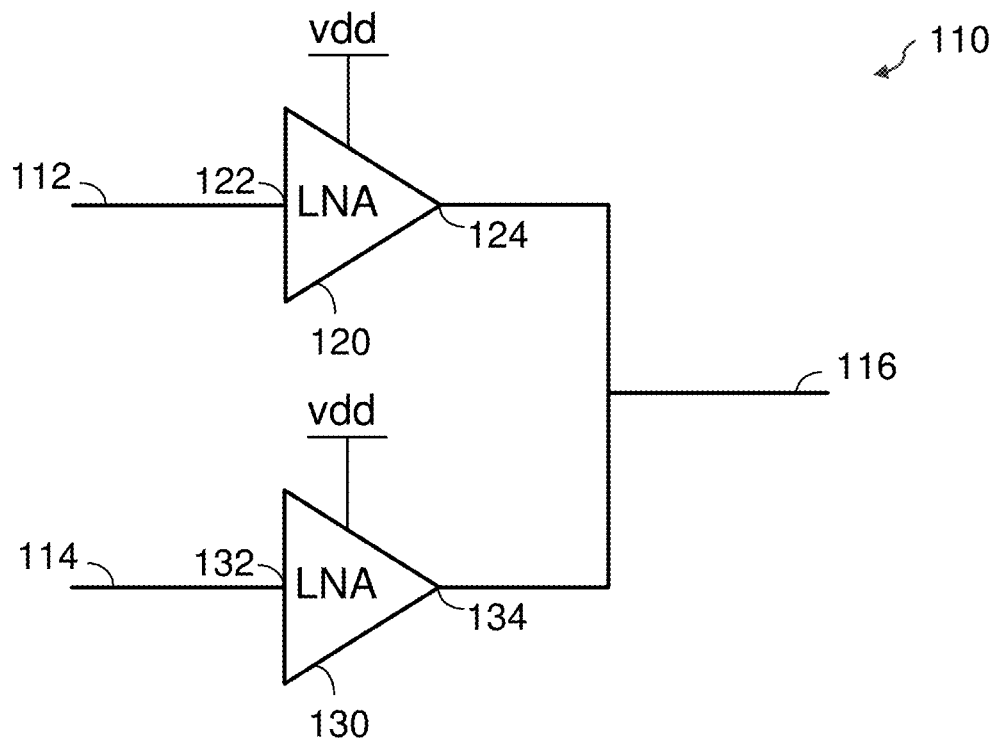
FIG. 1A shows an example of an amplifying circuit including a first low-noise amplifier and a second low-noise amplifier according to certain aspects of the present disclosure.

FIG. 1A shows an example of an amplifying circuit 110 according to certain aspects. The amplifying circuit 110 may be used, for example, in a receiver of a wireless device to amplify one or more signals in the wireless device, as discussed further below. The amplifying circuit 110 includes a first low-noise amplifier (LNA) 120 and a second LNA 130. In this example, the amplifying circuit 110 has a first input 112, a second input 114, and an output 116. The first LNA 120 has an input 122 coupled to the first input 112 of the amplifying circuit 110 and an output 124 coupled to the output 116 of the amplifying circuit 110. The second LNA 130 has an input 132 coupled to the second input 114 of the amplifying circuit 110 and an output 134 coupled to the output 116 of the amplifying circuit 110. Thus, in this example, the output 124 of the first LNA 120 and the output 134 of the second LNA 130 are both coupled to the output 116 of the amplifying circuit 110.

In certain aspects, the first LNA 120 is configured to receive a first signal via the first input 112 of the amplifying circuit 110, amplify the first signal, and output the amplified first signal to the output 116 of the amplifying circuit 110. The second LNA 130 is configured to receive a second signal via the second input 114 of the amplifying circuit 110, amplify the second signal, and output the amplified second signal to the output 116 of the amplifying circuit 110. When the first signal and the second signal are amplified simultaneously by the first LNA 120 and the second LNA 130, respectively, the amplified first signal and the amplified second signal are combined at the output 116 of the amplifying circuit 110.

In certain aspects, the amplifying circuit 110 may operate in a combining mode or a multiplexing mode at a given time, as discussed further below. In the combining mode, the first LNA 120 and the second LNA 130 are both turned on. In this mode, the amplifying circuit 110 may simultaneously receive the first signal and the second signal, in which the first signal and the second signal are amplified by the first LNA 120 and the second LNA 130, respectively, and combined at the output 116 of the amplifying circuit 110. The combining mode may be used, for example, during a carrier aggregation operation (e.g., inter-band CA operation), as discussed further below.

In the multiplexing mode, one of the first LNA 120 and the second LNA 130 is turned on while the other one of the first LNA 120 and the second LNA 130 is turned off. In this mode, one of the first signal and the second signal is amplified by the first LNA 120 or the second LNA 130, and output at the output 116 of the amplifying circuit 110.

Figure 1B:
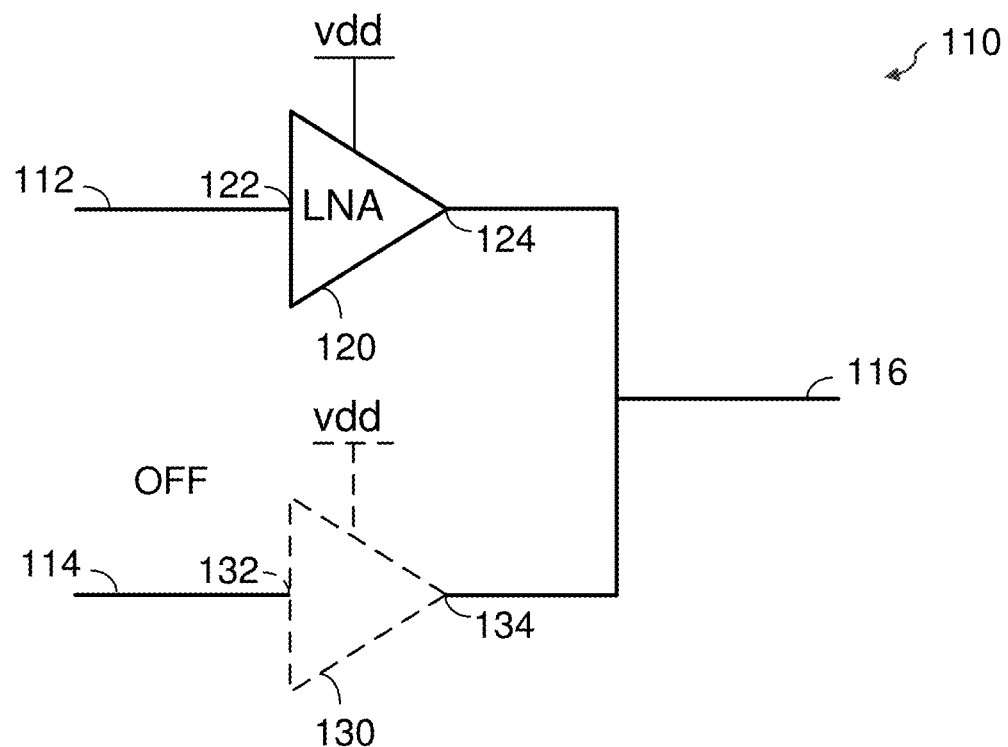
FIG. 1B shows an example of the amplifying circuit of FIG. 1A in which the first low-noise amplifier is turned on and the second low-noise amplifier is turned off according to certain aspects of the present disclosure.

In this regard, FIG. 1B shows an example in which the first LNA 120 is turned on and the second LNA 130 is turned off in the multiplexing mode. In FIG. 1B, the second LNA 130 is shown with dashed lines to indicate that the second LNA 130 is turned off. In this case, the first LNA 120 amplifies the first signal, and outputs the amplified first signal to the output 116 of the amplifying circuit 110.

Figure 1C:
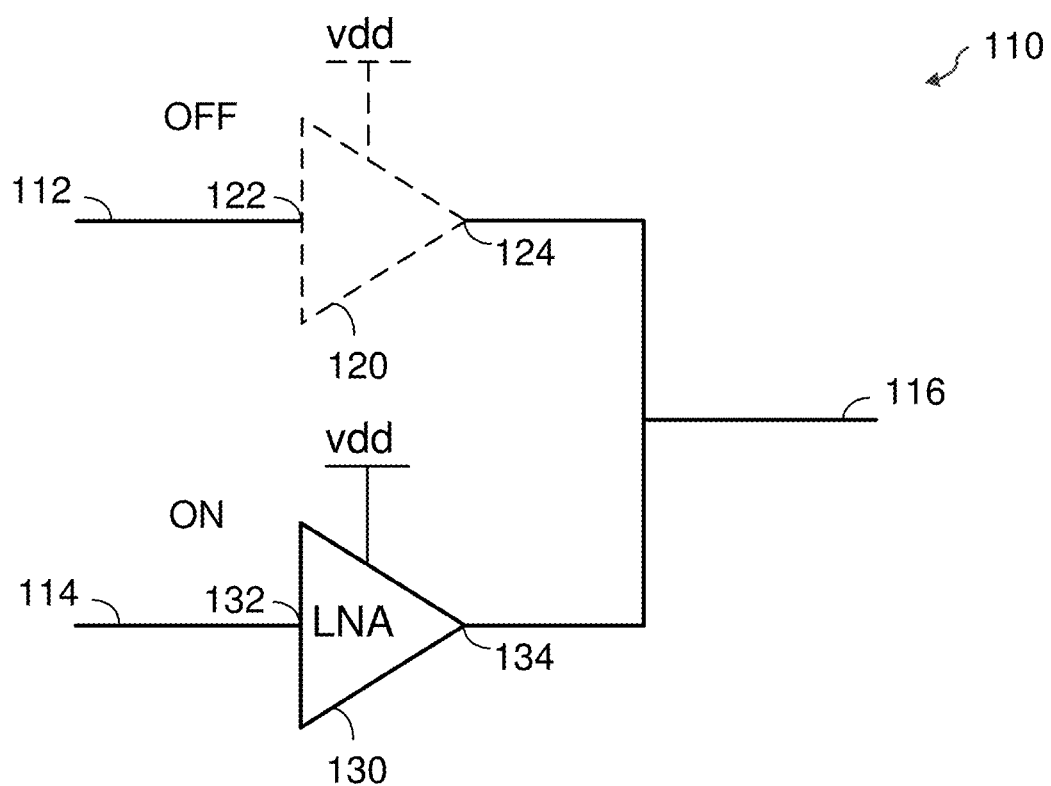
FIG. 1C shows an example of the amplifying circuit of FIG. 1A in which the first low-noise amplifier is turned off and the second low-noise amplifier is turned on according to certain aspects of the present disclosure.

FIG. 1C shows an example in which the second LNA 130 is turned on and the first LNA 120 is turned off in the multiplexing mode. In FIG. 1C, the first LNA 120 is shown with dashed lines to indicate that the first LNA 120 is turned off. In this case, the second LNA 130 amplifies the second signal, and outputs the amplified second signal to the output 116 of the amplifying circuit 110.

Thus, in the multiplexing mode, one of the first signal and the second signal is selected at a time by turning on the respective one of the first LNA 120 and the second LNA 130.

A challenge with implementing the amplifying circuit 110 is achieving high performance and/or power efficiency in the combining mode and the multiplexing mode. For example, in the combining mode, loading is an issue in which the first LNA 120 loads the second LNA 130 and the second LNA 130 loads the first LNA 120. The resulting loading effect reduces gain. To mitigate the loading effect, each of the first LNA 120 and the second LNA 130 may be implemented with a cascode amplifier. Implementing the first LNA 120 with a cascode amplifier gives the first LNA 120 a high output impedance which reduces the loading effect of the first LNA 120 on the second LNA 130. Similarly, implementing the second LNA 130 with a cascode amplifier gives the second LNA 130 a high output impedance which reduces the loading effect of the second LNA 130 on the first LNA 120.

However, implementing each of the first LNA 120 and the second LNA 130 with a cascode amplifier may reduce power efficiency in the multiplexing mode. In the multiplexing mode, the loading effect may be much less of an issue than in the combining mode. This is because one of the first LNA 120 and the second LNA 130 is turned off in the multiplexing mode, which significantly reduces the loading effect on the other one of the first LNA 120 and the second LNA 130 that is turned on. Accordingly, cascode amplifiers may not be needed to mitigate the loading effect in the multiplexing mode. A drawback of implementing each of the first LNA 120 and the second LNA 130 with a cascode amplifier in the multiplexing mode compared with a non-cascode amplifier is that a cascode amplifier may require a larger supply voltage (and hence higher power) to achieve a similar linearity performance as a non-cascode amplifier, which reduces power efficiency.

Thus, while implementing the first LNA 120 and the second LNA 130 with cascode amplifiers mitigates the loading effect in the combining mode, the cascode amplifiers may reduce power efficiency in the multiplexing mode compared with non-cascode amplifiers.

To address this, aspects of the present disclosure provide a reconfigurable amplifier that is configured to selectively operate in a cascode mode or a non-cascode mode. In the cascode mode, the reconfigurable amplifier operates as a cascode amplifier providing the reconfigurable amplifier with high output impedance to mitigate the loading effect. In the non-cascode mode, the reconfigurable amplifier operates as a non-cascode amplifier providing the reconfigurable amplifier with higher power efficiency. In certain aspects, multiple instances of the reconfigurable amplifier may be used in an amplifying circuit (e.g., amplifying circuit 110) to provide the amplifying circuit with a reconfigurable architecture that supports cascode operation in the combining mode to mitigate the loading effect and non-cascode operation in the multiplexing mode for high power efficiency, as discussed further below.

Figure 2A:
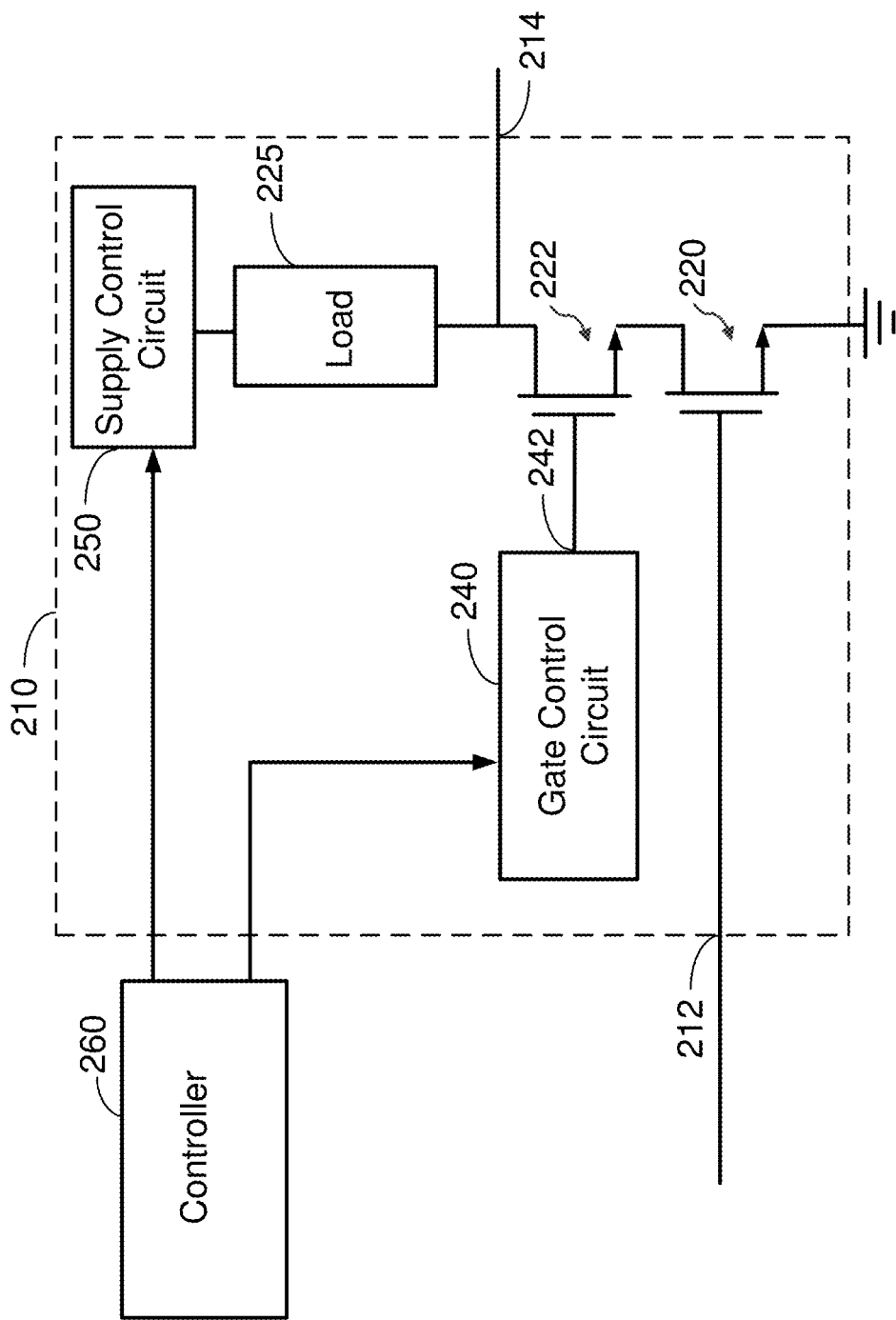
FIG. 2A shows an example of a reconfigurable amplifier according to certain aspects of the present disclosure.

FIG. 2A shows an example of a reconfigurable amplifier 210 having an input 212 and an output 214 according to certain aspects. The reconfigurable amplifier 210 is configured to receive a signal at the input 212, amplify the received signal, and output the resulting amplified signal at the output 214. As discussed further below, the reconfigurable amplifier 210 is configured to selectively operate in a cascode mode or a non-cascode mode. As used herein, the "cascode mode" is a mode in which a transistor in the reconfigurable amplifier 210 operates as a common gate amplifier coupled to the output of the amplifier. The common gate amplifier may also be referred to as a common gate stage or a common gate transistor. The "non-cascode mode" is a mode in which the transistor is not being operated as the common gate amplifier (e.g., the transistor acts as a switch with low on resistance).

The reconfigurable amplifier 210 includes a first transistor 220, a second transistor 222, a load 225, a gate control circuit 240, and a supply control circuit 250. The first transistor 220 has a gate coupled to the input 212 of the reconfigurable amplifier 210, a source coupled to ground, and a drain. The second transistor 222 has a gate coupled to an output 242 of the gate control circuit 240, a source coupled to the drain of the first transistor 220, and a drain coupled to the output 214 of the reconfigurable amplifier 210. In the example shown in FIG. 2A, each of the first transistor 220 and the second transistor 222 is implemented with a respective n-type field effect transistor (NFET). However, it is to be appreciated that the present disclosure is not limited to this example.

The load 225 is coupled between the supply control circuit 250 and the output 214 of the reconfigurable amplifier 210. The load 225 may include an active load (e.g., one or more transistors), a reactive load (e.g., an inductor and/or a capacitor), a resistive load, or any combination thereof.

The gate control circuit 240 is configured to cause the reconfigurable amplifier 210 to operate in the cascode mode or the non-cascode mode by controlling a gate voltage of the second transistor 222, as discussed further below.

To operate the reconfigurable amplifier 210 in the cascode mode, the gate control circuit 240 is configured to output a bias voltage Vbiasn to the gate of the second transistor 222, in which the bias voltage Vbiasn biases the second transistor 222 in the saturation region. This causes the second transistor 222 to operate as a common gate amplifier (also referred to as a common gate stage) between the drain of the first transistor 220 and the output 214 of the reconfigurable amplifier 210. Operating the second transistor 222 as a common gate amplifier provides a high impedance at the drain of the second transistor 222. Since the drain of the second transistor 222 is coupled to the output 214, the high impedance at the drain of the second transistor 222 helps the reconfigurable amplifier 210 achieve a high output impedance, which mitigates the loading effect discussed above. In the cascode mode, the first transistor 220 operates as a common source amplifier or transconductance amplifier.

To operate the reconfigurable amplifier 210 in the non-cascode mode, the gate control circuit 240 is configured to output a switch voltage to the gate of the second transistor 222 that causes the second transistor 222 to operate in the triode region (i.e., biases the second transistor in the triode region). The triode region may also be referred to as the triode mode, the linear region or mode, or another term. In the triode region, the second transistor 222 acts as a good switch (i.e., a switch with a very low on resistance), which provides a very low resistance path between the output 214 of the reconfigurable amplifier 210 and the drain of the first transistor 220. Because the second transistor 222 acts as a good switch, the voltage drop across the second transistor 222 is very small, which increases headroom and allows the reconfigurable amplifier 210 to achieve high linearity performance at a lower supply voltage compared with the cascode mode, thereby increasing power efficiency. In the non-cascode mode, the first transistor 220 operates as a common source amplifier.

The supply control circuit 250 is configured to control the supply voltage of the reconfigurable amplifier 210 depending on whether the reconfigurable amplifier 210 is operating in the cascode mode or the non-cascode mode. In certain aspects, the supply control circuit 250 is configured to provide the load 225 with a first supply voltage Vdd_hi in the cascode mode and a second supply voltage Vdd_lo in the non-cascode mode, in which the first supply voltage Vdd_hi is higher than the second supply voltage Vdd_lo. In these aspects, the higher supply voltage (i.e., the first supply voltage Vdd_hi) may be used in the cascode mode to achieve good linearity performance in the cascode mode. This is because the cascode mode may need a higher supply voltage than the non-cascode mode to achieve similar linearity performance. In these aspects, the lower supply voltage (i.e., the second supply voltage Vdd_lo) may be used in the non-cascode mode to increase power efficiency in the non-cascode mode since the non-cascode mode may achieve high linearity performance at a lower supply voltage than the cascode mode.

In certain aspects, a controller 260 is coupled to the gate control circuit 240 and the supply control circuit 250. The controller 260 is configured to control the gate control circuit 240 and the supply control circuit 250 to operate the reconfigurable amplifier 210 in the cascode mode or the non-cascode mode, as discussed further below.

To operate the reconfigurable amplifier 210 in the cascode mode, the controller 260 instructs the gate control circuit 240 to output the bias voltage Vbiasn to the gate of the second transistor 222 and instructs the supply control circuit 250 to provide the first supply voltage Vdd_hi. In this regard, FIG. 2B illustrates exemplary operating conditions of the reconfigurable amplifier 210 in the cascode mode. In this example, the gate control circuit 240 (not shown in FIG. 2B) biases the gate of the second transistor 222 with the bias voltage Vbiasn and the supply control circuit 250 (not shown in FIG. 2B) provides the first supply voltage Vdd_hi to the load 225 (e.g., the load 225 is coupled between the first supply voltage Vdd_hi and the output 214). As discussed above, biasing the gate of the second transistor 222 with the bias voltage Vbiasn operates the second transistor 222 in the saturation region, which causes the second transistor 222 to operate as a common gate amplifier that helps provides the reconfigurable amplifier 210 with a high output impedance.

To operate the reconfigurable amplifier 210 in the non-cascode mode, the controller 260 instructs the gate control circuit 240 to output the switch voltage to the gate of the second transistor 222 and instructs the supply control circuit 250 to provide the second supply voltage Vdd_lo. In this regard, FIG. 2C illustrates exemplary operating conditions of the reconfigurable amplifier 210 in the non-cascode mode. In this example, the gate control circuit 240 (not shown in FIG. 2C) outputs the switch voltage to the gate of the second transistor 222 and the supply control circuit 250 (not shown in FIG. 2C) provides the second supply voltage Vdd_lo to the load 225 (e.g., the load 225 is coupled between the second supply voltage Vdd_lo and the output 214). As discussed above, the switch voltage operates the second transistor 222 in the triode region, which causes the second transistor 222 to act as a good switch (i.e., switch with very low on resistance). In the example shown in FIG. 2C, the switch voltage is provided by the second supply voltage Vdd_lo (i.e., the switch voltage is equal to the second supply voltage Vdd_lo in this example). However, it is to be appreciated that the switch voltage is not limited to this example, and that other voltages that operate the second transistor 222 in the triode region may be used.

In certain aspects, the supply control circuit 250 may be configured to turn off the reconfigurable amplifier 210 by decoupling both the first supply voltage Vdd_hi and the second supply voltage Vdd_lo from the load 225. In these aspects, the controller 260 may instruct the supply control circuit 250 to turn off the reconfigurable amplifier 210 (e.g., to conserve power when the reconfigurable amplifier 210 is not being used). In response, the supply control circuit 250 decouples both the first supply voltage Vdd_hi and the second supply voltage Vdd_lo from the load 225.

Figure 3A:
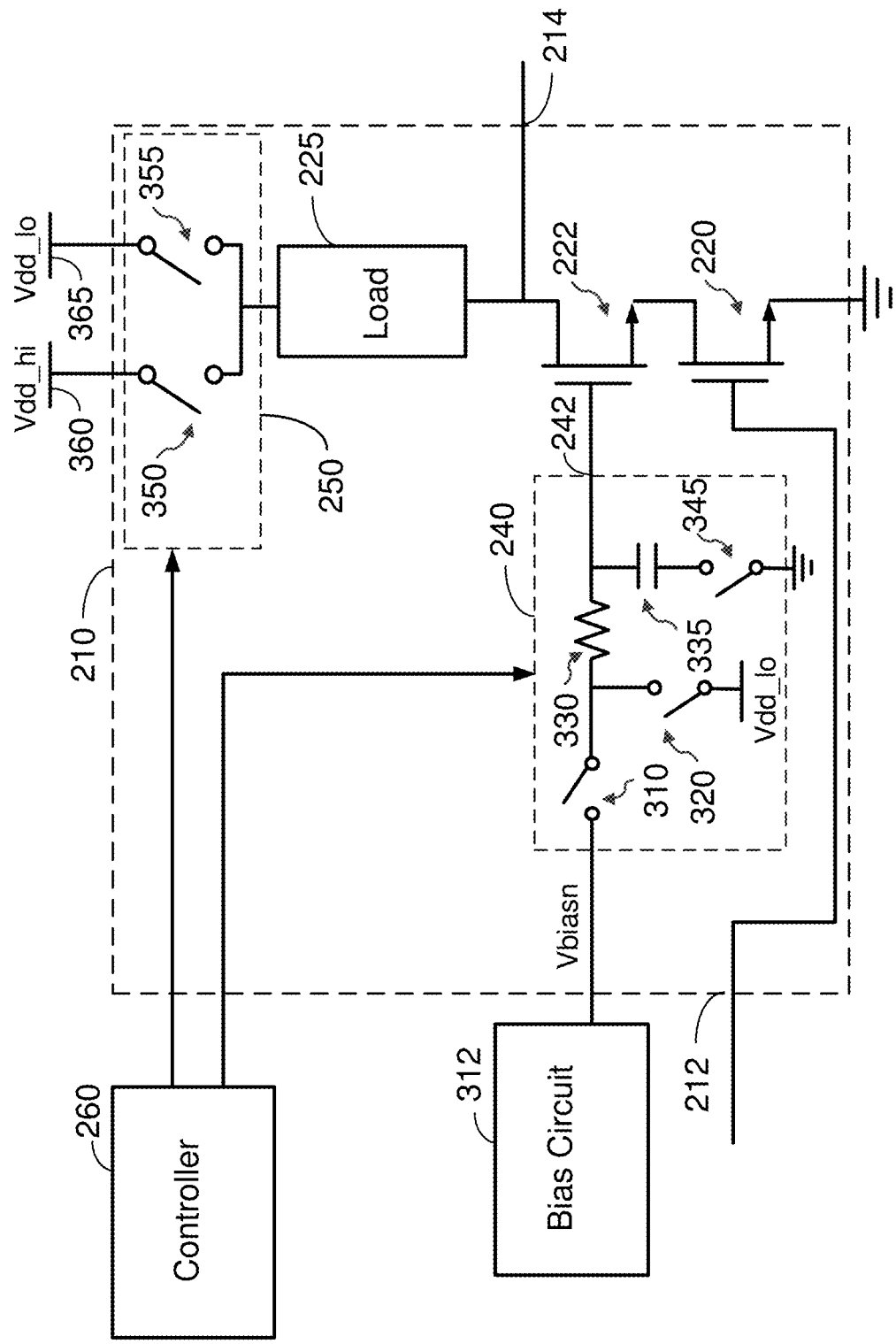
FIG. 3A shows an exemplary implementation of a gate control circuit and a supply control circuit in a reconfigurable amplifier according to certain aspects of the present disclosure.

FIG. 3A shows an exemplary implementation of the gate control circuit 240 and the supply control circuit 250 according to certain aspects.

In this example, the gate control circuit 240 includes a first switch 310, a second switch 320, a resistor 330, a third switch 345, and an AC coupling capacitor 335. The first switch 310 is coupled between the resistor 330 and a bias circuit 312. In this example, the bias circuit 312 is configured to output the bias voltage Vbiasn. The bias circuit 312 may be implemented with a band-gap circuit, a voltage divider, or any combination thereof. The second switch 320 is coupled between the resistor 330 and the switch voltage (e.g., the second supply voltage Vdd_lo). The resistor 330 is coupled between the first switch 310 and the gate of the second transistor 222, and between the second switch 320 and the gate of the second transistor 222. The third switch 345 is coupled between the AC coupling capacitor 335 and ground, and the AC coupling capacitor 335 is coupled between the gate of the second transistor 222 and the third switch 345.

The on/off states of the first switch 310, the second switch 320, and the third switch 345 are controlled by the controller 260, as discussed further below. For ease of illustration, the individual connections between the controller 260 and each of the first switch 310, the second switch 320, and the third switch 345 are not explicitly shown in FIG. 3A.

In this example, the supply control circuit 250 includes a fourth switch 350 and a fifth switch 355. The fourth switch 350 is coupled between the first supply voltage Vdd_hi and the load 225, and the fifth switch 355 is coupled between the second supply voltage Vdd_lo and the load 225. In the example in FIG. 3A, the first supply voltage Vdd_hi is on a first supply rail 360 and the second supply voltage Vdd_lo is on a second supply rail 365. In this example, the fourth switch 350 is coupled between the first supply rail 360 and the load 225, and the fifth switch 355 is coupled between the second supply rail 365 and the load 225.

The on/off states of the fourth switch 350 and the fifth switch 355 are controlled by the controller 260, as discussed further below. For ease of illustration, the individual connections between the controller 260 and each of the fourth switch 350 and the fifth switch 355 are not explicitly shown in FIG. 3A.

Figure 3B:
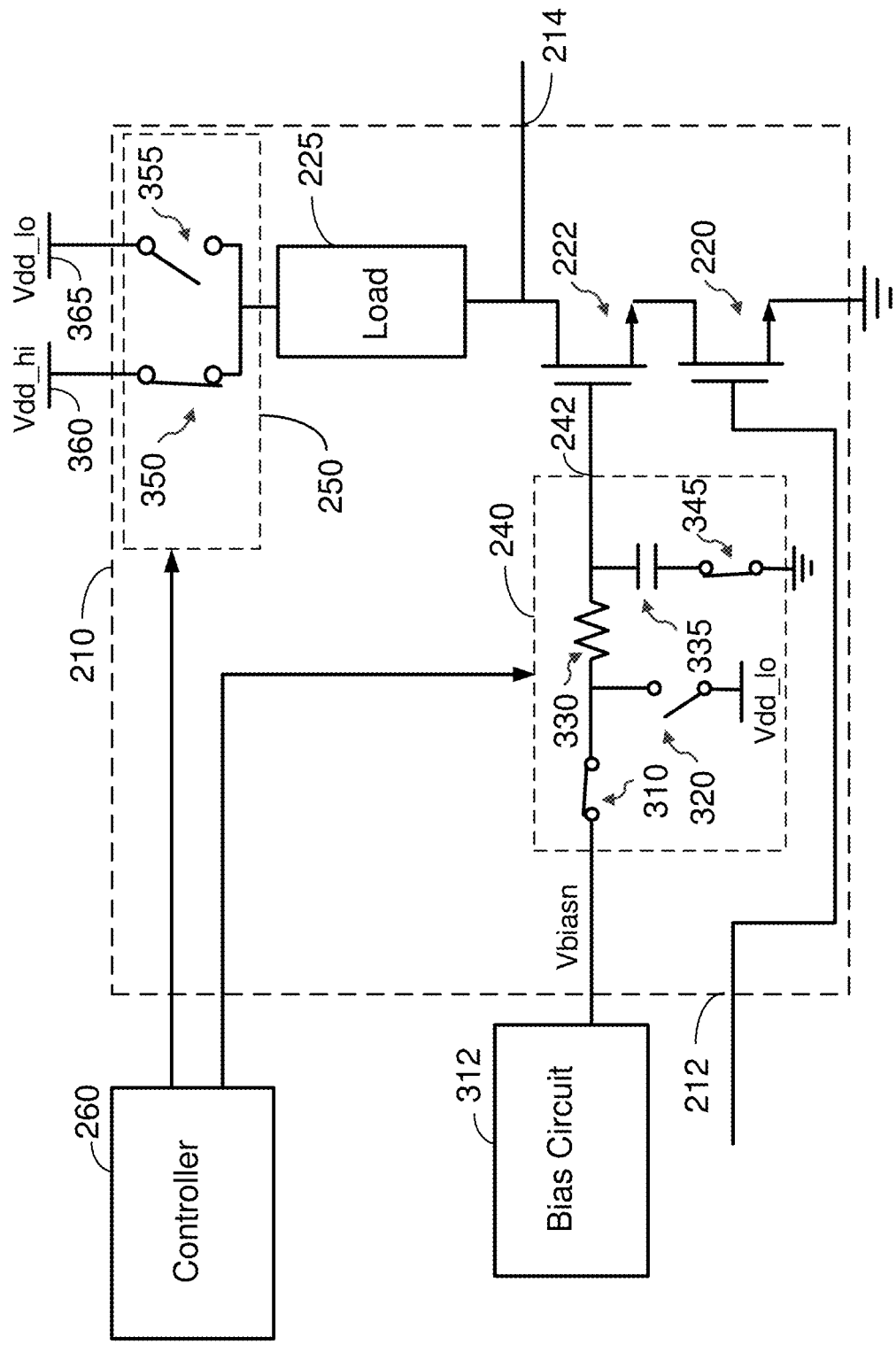
FIG. 3B illustrates an example of the reconfigurable amplifier of FIG. 3A in a cascode mode according to certain aspects of the present disclosure.

FIG. 3B illustrates the reconfigurable amplifier 210 in the cascode mode according to certain aspects. In the cascode mode, the controller 260 turns on the first switch 310, turns on the third switch 345, and turns off the second switch 320 in the gate control circuit 240. Turning on the first switch 310 couples the bias circuit 312 to the gate of the second transistor 222 via the resistor 330. This allows the bias circuit 312 to bias the gate of the second transistor 222 with the bias voltage Vbiasn. The resistor 330 may be used to help attenuate any AC signal between the bias circuit 312 and the gate of the second transistor 222. Turning on the third switch 345 couples the AC coupling capacitor 335 to ground. As a result, the AC coupling capacitor 335 capacitively couples the gate of the second transistor 222 to ground, which shunts AC signals to ground. This may be done, for example, to suppress any AC signal on the gate of the second transistor 222 without disturbing the bias voltage Vbiasn, which is a DC voltage in certain aspects.

In the cascode mode, the controller 260 turns on the fourth switch 350 and turns off the fifth switch 355 in the supply control circuit 250. Turning on the fourth switch 350 couples the first supply voltage Vdd_hi on the first supply rail 360 to the load 225.

Figure 3C:
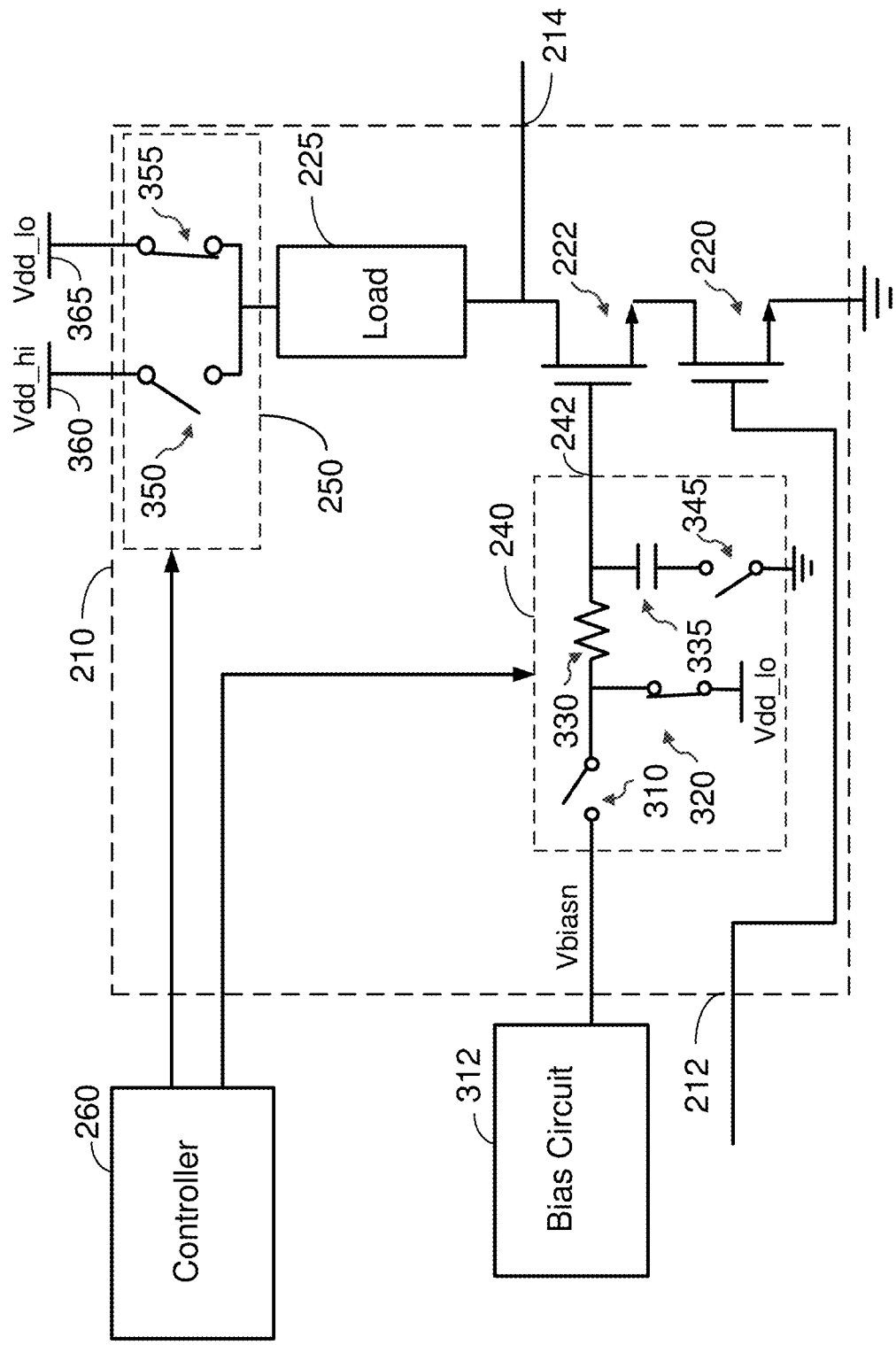
FIG. 3C illustrates an example of the reconfigurable amplifier of FIG. 3A in a non-cascode mode according to certain aspects of the present disclosure.

FIG. 3C illustrates the reconfigurable amplifier 210 in the non-cascode mode according to certain aspects. In the non-cascode mode, the controller 260 turns off the first switch 310, turns off the third switch 345, and turns on the second switch 320 in the gate control circuit 240. Turning on the second switch 320 couples the switch voltage (e.g., the second supply voltage Vdd_lo) to the gate of the second transistor 222 via the resistor 330. As discussed above, the switch voltage operates the second transistor 222 in the triode region, causing the second transistor 222 to act as a good switch (i.e., a switch with very low on resistance) between the drain of the first transistor 220 and the output 214.

In the non-cascode mode, the AC coupling capacitor 335 is decoupled from the ground since the third switch 345 is turned off. This may be done to allow the gate of the second transistor 222 to track voltage swings at the source of the second transistor 222 due to the signal at the source of the second transistor 222. In this example, the voltage swings may be capacitively coupled to the gate of the second transistor 222 via a source-to-gate capacitance of the second transistor 222. Tracking the voltage swings at the gate of the second transistor 222 helps prevent the gate-to-source voltage of the second transistor 222 from varying in the non-cascode mode. This, in turn, helps prevent the resistance of the second transistor 222 between the output 214 and the drain of the first transistor 220 from varying due to variations in the gate-to-source voltage of the second transistor 222.

In the non-cascode mode, the controller 260 turns off the fourth switch 350 and turns on the fifth switch 355 in the supply control circuit 250. Turning on the fifth switch 355 couples the second supply voltage Vdd_lo on the second supply rail 365 to the load 225.

To turn off the reconfigurable amplifier 210, the controller 260 may turn off the fourth switch 350 and the fifth switch 355. This decouples both the first supply voltage Vdd_hi and the second supply voltage Vdd_lo from the load 225.

Figure 4A:
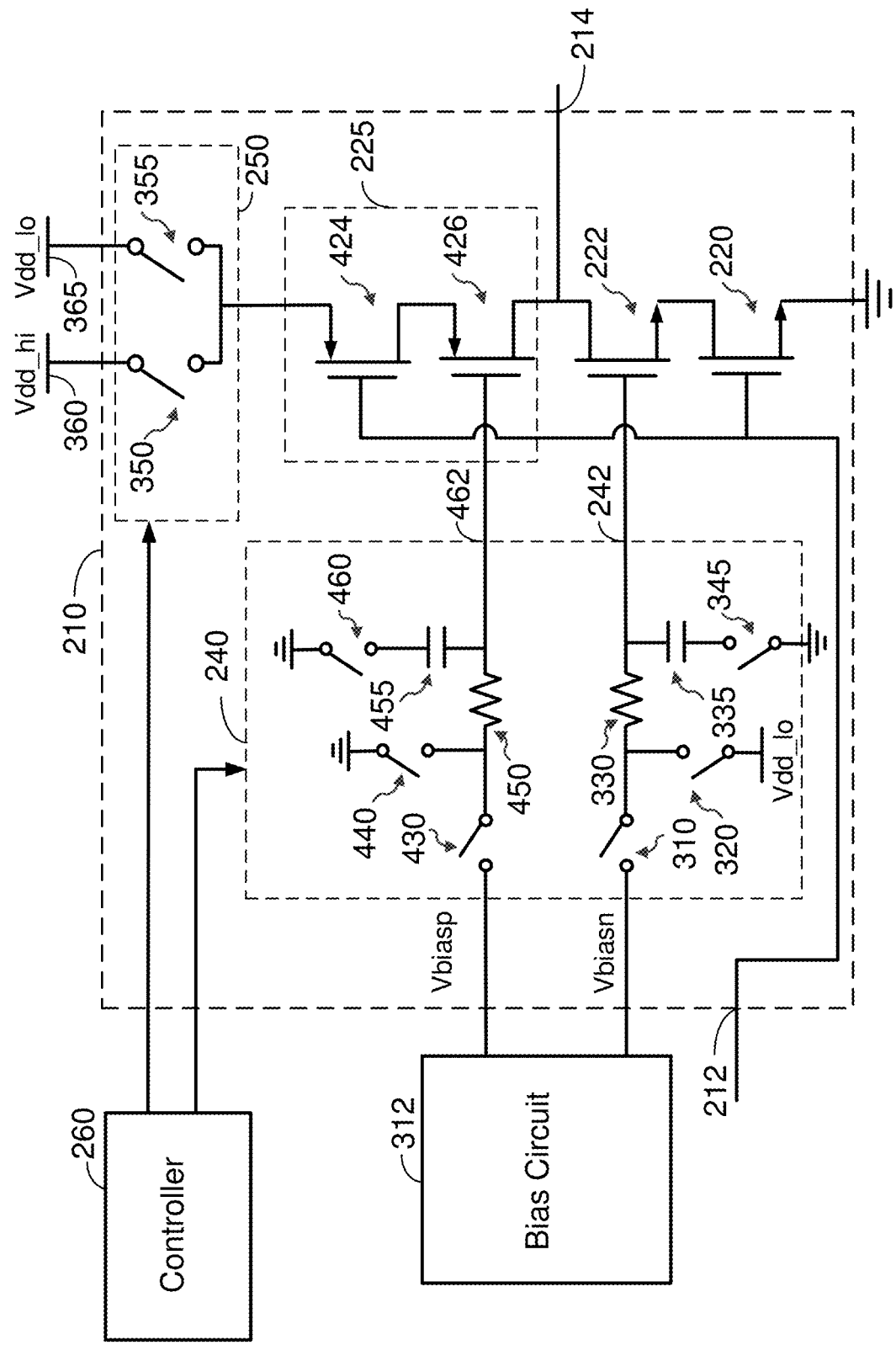
FIG. 4A shows an exemplary implementation of a load in a reconfigurable amplifier according to certain aspects of the present disclosure.

FIG. 4A shows an exemplary implementation of the load 225 according to certain aspects. In this example, the load 225 includes a third transistor 424 and a fourth transistor 426. The third transistor 424 has a gate coupled to the input 212 of the reconfigurable amplifier 210, a source coupled to the supply control circuit 250, and a drain. The fourth transistor 426 has a gate coupled to a second output 462 of the gate control circuit 240, a source coupled to the drain of the third transistor 424, and a drain coupled to the output 214 of the reconfigurable amplifier 210. In the example shown in FIG. 4A, each of the third transistor 424 and the fourth transistor 426 is implemented with a respective p-type field effect transistor (PFET). However, it is to be appreciated that the present disclosure is not limited to this example. In this example, the third transistor 424 also provides transconductance based on the voltage of the signal at the input 212.

It is to be appreciated that the load 225 is not limited to the example shown in FIG. 4A. For example, in some implementations, the load 225 may include one or more reactive components and/or one or more resistive elements (e.g., an inductor-capacitor (LC) tank, a resistor-inductor-capacitor (RLC) tank, etc.). In another example, the load 225 may include a current source.

In the cascode mode, the gate control circuit 240 is configured to output the bias voltage Vbiasp to the gate of the fourth transistor 426, in which the bias voltage Vbiasp biases the fourth transistor 426 in the saturation region. This causes the fourth transistor 426 to operate as a common gate amplifier (e.g., current buffer) between the drain of the third transistor 424 and the output 214 of the reconfigurable amplifier 210. Operating the fourth transistor 426 as a common gate amplifier provides a high impedance at the drain of the fourth transistor 426. Since the drain of the fourth transistor 426 is coupled to the output 214, the high impedance at the drain of the fourth transistor 426 helps the reconfigurable amplifier 210 achieve a high output impedance, which mitigates the loading effect discussed above.

As discussed above, the gate control circuit 240 also biases the gate of the second transistor 222 with the bias voltage Vbiasn in the cascode mode to operate the second transistor 222 in the saturation region. In this example, the bias voltage Vbiasn may be referred to as a first bias voltage and the bias voltage Vbiasp may be referred to as a second bias voltage.

In the non-cascode mode, the gate control circuit 240 is configured to couple the gate of the fourth transistor 426 to ground. This causes the fourth transistor 426 to operate in the triode region (also referred to as the linear region) since the fourth transistor 426 is implemented with a PFET in this example. In the triode region, the fourth transistor 426 acts as a good switch (i.e., a switch with a very low on resistance), which provides a very low resistance path between the drain of the third transistor 424 and the output 214 of the reconfigurable amplifier 210.

As discussed above, the gate control circuit 240 also outputs the switch voltage (e.g., the second supply voltage Vdd_lo) to the gate of the second transistor 222 in the non-cascode mode to operate the second transistor 222 in the triode region, which causes the second transistor 222 to act as a good switch.

FIG. 4A also shows an exemplary implementation of the gate control circuit 240. In this example, the gate control circuit 240 includes the first switch 310, the second switch 320, the resistor 330, the third switch 345, and the AC coupling capacitor 335 discussed above. The gate control circuit 240 also includes a sixth switch 430, a seventh switch 440, a second resistor 450, an eighth switch 460, and a second AC coupling capacitor 455. In the discussion below, the resistor 330 may be referred to as the first resistor and the AC coupling capacitor 335 may be referred to as the first AC coupling capacitor.

The sixth switch 430 is coupled between the second resistor 450 and the bias circuit 312. In this example, the bias circuit 312 is configured to output the bias voltage Vbiasp to the sixth switch 430. The seventh switch 440 is coupled between the second resistor 450 and ground. The second resistor 450 is coupled between the sixth switch 430 and the gate of the fourth transistor 426, and between the seventh switch 440 and the gate of the fourth transistor 426. The eighth switch 460 is coupled between the second AC coupling capacitor 455 and ground, and the second AC coupling capacitor 455 is coupled between the gate of the fourth transistor 426 and the eighth switch 460.

The on/off states of the sixth switch 430, the seventh switch 440, and the eighth switch 460 are controlled by the controller 260, as discussed further below. For ease of illustration, the individual connections between the controller 260 and each of the sixth switch 430, the seventh switch 440, and the eighth switch 460 are not explicitly shown in FIG. 4A.

Figure 4B:
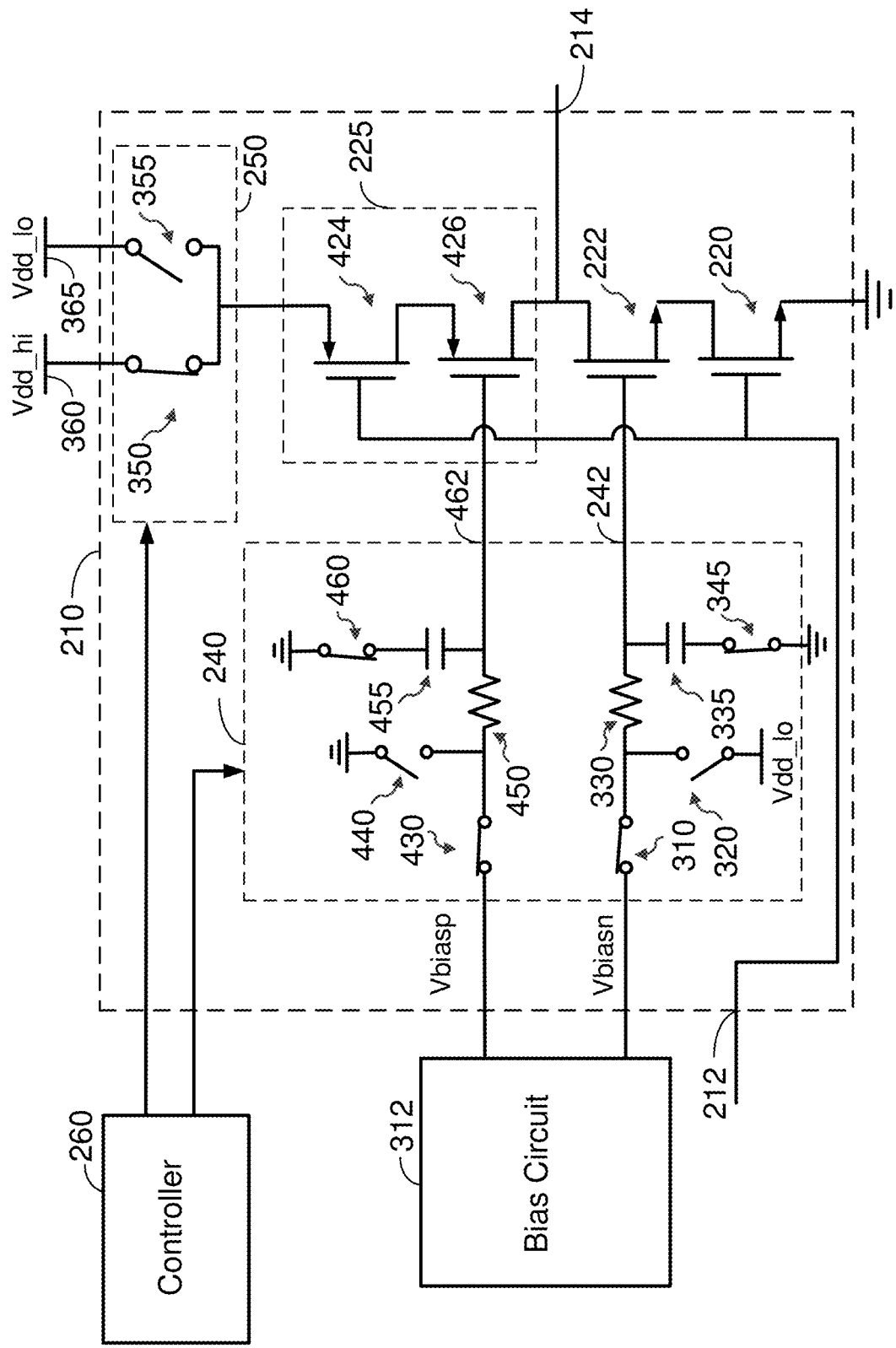
FIG. 4B illustrates an example of the reconfigurable amplifier of FIG. 4A in a cascode mode according to certain aspects of the present disclosure.

FIG. 4B illustrates the reconfigurable amplifier 210 in the cascode mode according to certain aspects. In the cascode mode, the controller 260 turns on the first switch 310, turns on the third switch 345, and turns off the second switch 320 in the gate control circuit 240, as discussed above with reference to FIG. 3B. The controller 260 also turns on the sixth switch 430, turns on the eighth switch 460, and turns off the seventh switch 440 in the gate control circuit 240. Turning on the sixth switch 430 couples the bias circuit 312 to the gate of the fourth transistor 426 via the second resistor 450. This allows the bias circuit 312 to bias the gate of the fourth transistor 426 with the bias voltage Vbiasp. The second resistor 450 may be used to help attenuate any AC signal between the bias circuit 312 and the gate of the fourth transistor 426. Turning on the eighth switch 460 couples the second AC coupling capacitor 455 to ground. As a result, the second AC coupling capacitor 455 capacitively couples the gate of the fourth transistor 426 to ground, which shunts AC signals to ground. This may be done, for example, to suppress any AC signal on the gate of the fourth transistor 426 without disturbing the bias voltage Vbiasp, which is a DC voltage in certain aspects.

As discussed above with reference to FIG. 3B, the controller 260 turns on the fourth switch 350 and turns off the fifth switch 355 in the supply control circuit 250 in the cascode mode to provide the load 225 with the first supply voltage Vdd_hi in the cascode mode.

Figure 4C:
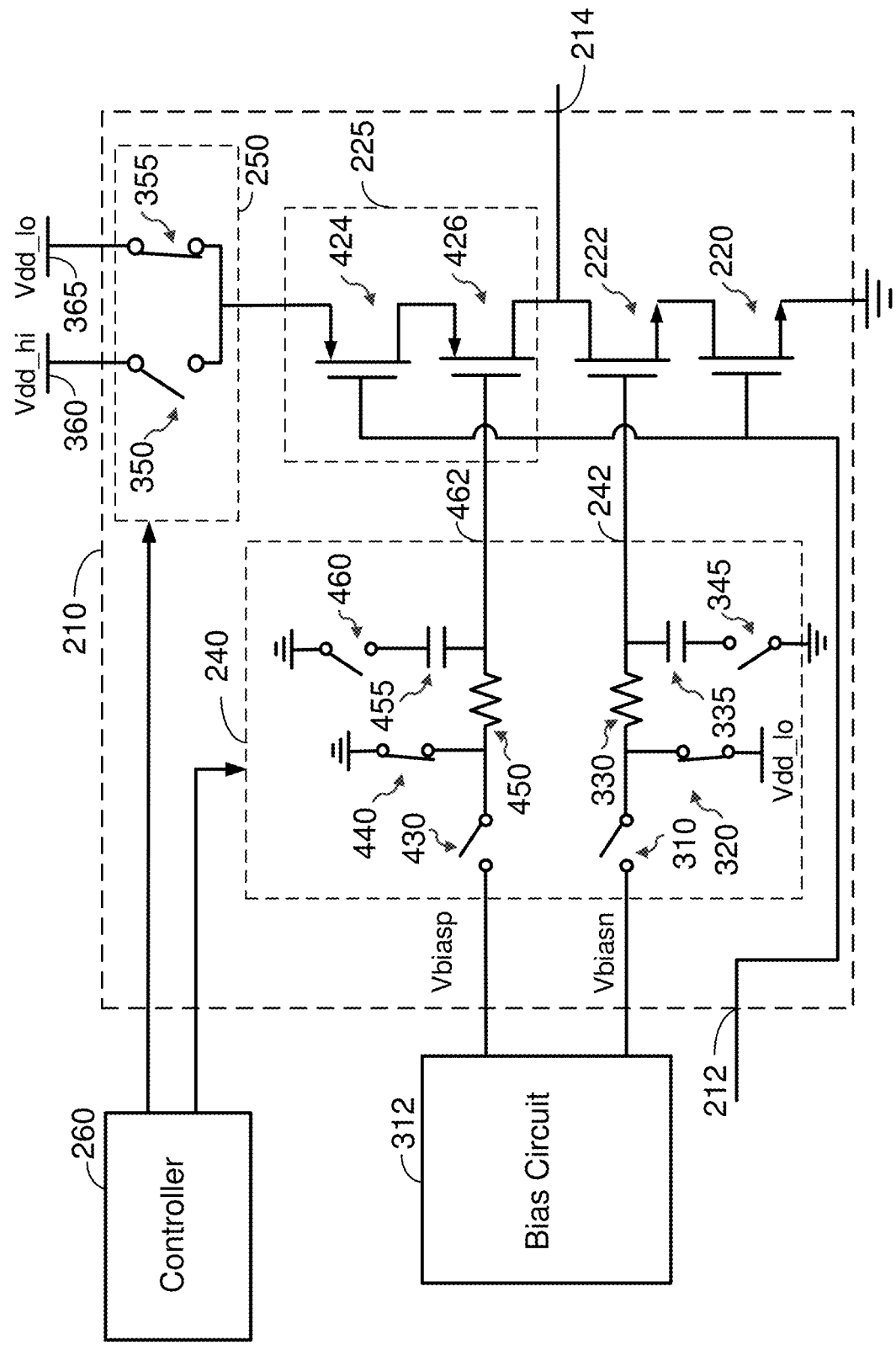
FIG. 4C illustrates an example of the reconfigurable amplifier of FIG. 4A in a non-cascode mode according to certain aspects of the present disclosure.

FIG. 4C illustrates the reconfigurable amplifier 210 in the non-cascode mode according to certain aspects. In the non-cascode mode, the controller 260 turns off the first switch 310, turns off the third switch 345, and turns on the second switch 320 in the gate control circuit 240, as discussed above with reference to FIG. 3C. The controller 260 also turns on the seventh switch 440, turns off the sixth switch 430, and turns off the eighth switch 460. Turning on the seventh switch 440 couples the gate of the fourth transistor 426 to the ground via the second resistor 450. As discussed above, coupling the gate of the fourth transistor 426 (which is a PFET in this example) to ground operates the fourth transistor 426 in the triode region, causing the fourth transistor 426 to operate as a good switch between the drain of the third transistor 424 and the output 214.

As discussed above with reference to FIG. 3C, the controller 260 turns off the fourth switch 350 and turns on the fifth switch 355 in the supply control circuit 250 in the non-cascode mode to provide the load 225 with the second supply voltage Vdd_lo in the non-cascode mode.

Figure 5:
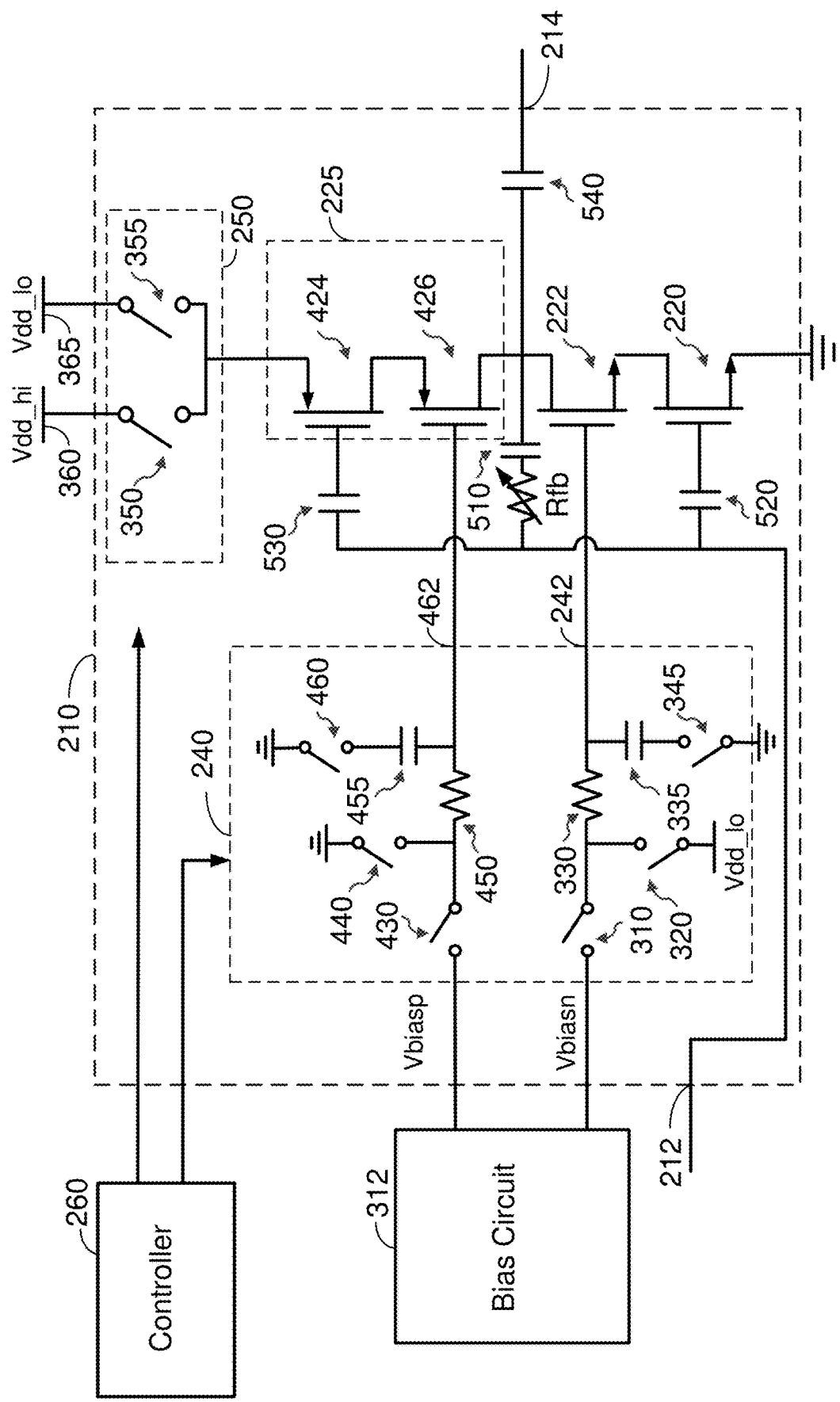
FIG. 5 shows an example of a reconfigurable amplifier including a feedback resistor and coupling capacitors according to certain aspects of the present disclosure.

It is to be appreciated that the reconfigurable amplifier 210 may include one or more additional components not shown in FIGS. 2A, 3A, and 4A. In this regard, FIG. 5 shows an example in which the reconfigurable amplifier 210 includes a feedback resistor Rfb coupled between the output 214 and the input 212 (e.g., to improve linearity). In this example, the feedback resistor Rfb is capacitively coupled to the output 214 by capacitor 510. FIG. 5 also shows an example in which the reconfigurable amplifier 210 includes a first input coupling capacitor 520 coupled between the gate of the first transistor 220 and the input 212, a second input coupling capacitor 530 coupled between the gate of the third transistor 424 and the input 212, and an output coupling capacitor 540 coupled to the output 214. For example, the gate of the first transistor 220 may be DC biased by a first gate bias voltage and the gate of the third transistor 424 may be DC biased by a second gate bias voltage by a gate bias circuit (not shown). In this example, the first input coupling capacitor 520 may be configured to pass a signal from the input 212 to the gate of the first transistor 220 while blocking the first gate bias voltage from the input 212, and the second input coupling capacitor 530 may be configured to pass the signal from the input 212 to the gate of the third transistor 424 while blocking the second gate bias voltage from the input 212.

Figure 6:
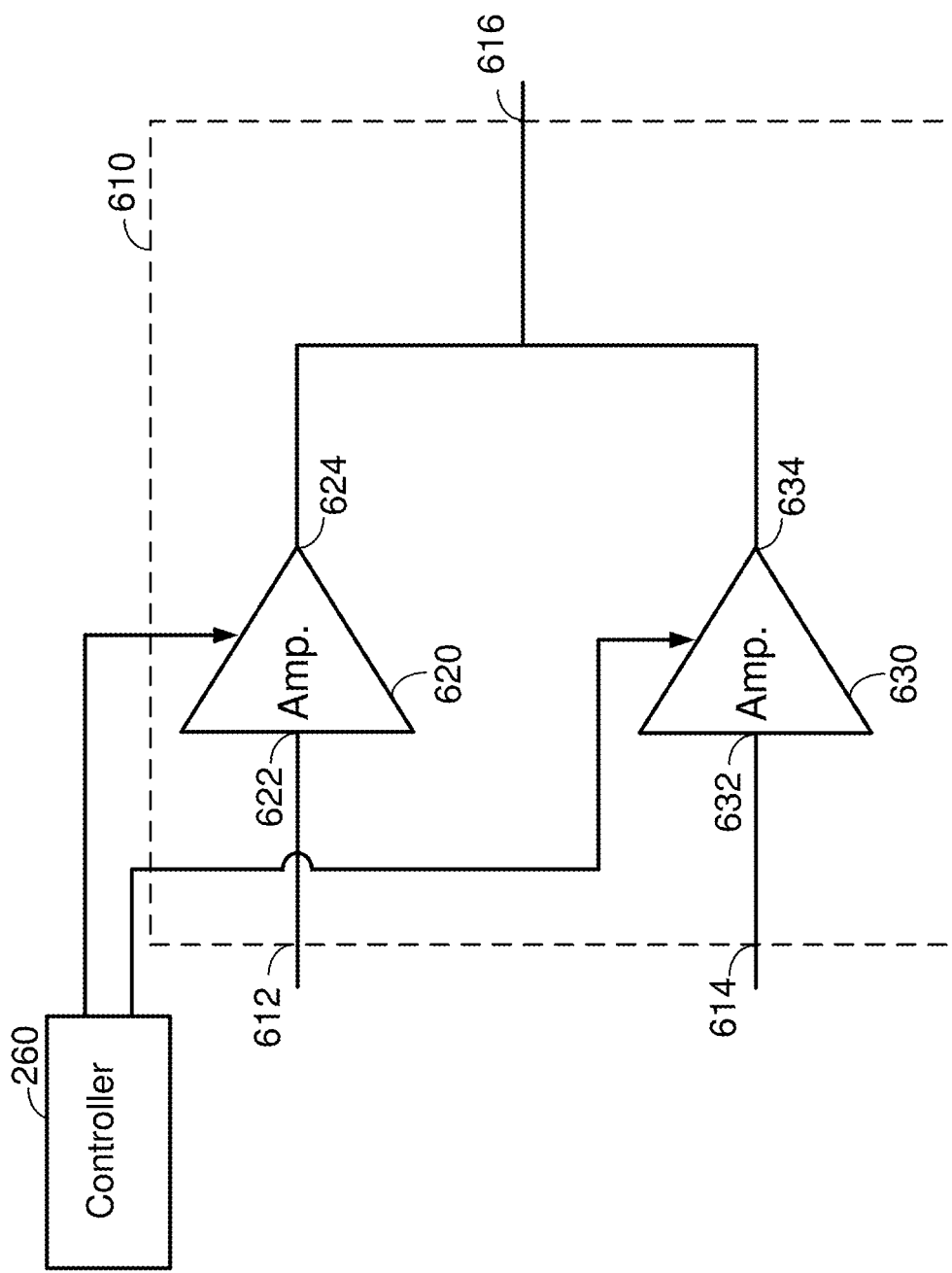
FIG. 6 shows an example of a reconfigurable amplifying circuit according to certain aspects of the present disclosure.

Multiple instances of the reconfigurable amplifier 210 according to various aspects of the present disclosure may be used in an amplifying circuit to provide the amplifying circuit with a reconfigurable architecture. In this regard, FIG. 6 shows an example of an amplifying circuit 610 including a first reconfigurable amplifier 620 and a second reconfigurable amplifier 630 according to certain aspects. The amplifying circuit 610 may be used, for example, in a receiver of a wireless device to amplify one or more signals in the receiver. The one or more signals may include one or more RF signals, one or more intermediate frequency (IF) signals, etc. However, it is to be appreciated that the amplifying circuit 610 is not limited to this example and may be used in other applications.

Each of the first reconfigurable amplifier 620 and the second reconfigurable amplifier 630 may be implemented with the reconfigurable amplifier 210 according to any of the exemplary aspects shown in FIGS. 2A, 3A, 4A, and 5 (i.e., each of the first reconfigurable amplifier 620 and the second reconfigurable amplifier 630 may be a separate instance of the reconfigurable amplifier 210). Thus, the description of the reconfigurable amplifier 210 given above may apply to each of the first reconfigurable amplifier 620 and the second reconfigurable amplifier 630.

Each of the first reconfigurable amplifier 620 and the second reconfigurable amplifier 630 is configured to selectively operate in the cascode mode or the non-cascode mode under the control of the controller 260 as discussed above and illustrated in FIGS. 2B, 2C, 3B, 3C, 4B, and 4C according to various aspects. In the example shown in FIG. 6, the controller 260 is coupled to the first reconfigurable amplifier 620 and the second reconfigurable amplifier 630. As discussed further below, the controller 260 controls whether each of the first reconfigurable amplifier 620 and the second reconfigurable amplifier 630 operates in the cascode mode or the non-cascode mode.

In the example shown in FIG. 6, the amplifying circuit 610 has a first input 612, a second input 614, and an output 616. The first reconfigurable amplifier 620 has an input 622 (e.g., respective instance of input 212) coupled to the first input 612 of the amplifying circuit 610 and an output 624 (e.g., respective instance of output 214) coupled to the output 616 of the amplifying circuit 610. The second reconfigurable amplifier 630 has an input 632 (e.g., respective instance of input 212) coupled to the second input 614 of the amplifying circuit 610 and an output 634 (e.g., respective instance of output 214) coupled to the output 616 of the amplifying circuit 610. Thus, in this example, the output 624 of the first reconfigurable amplifier 620 and the output 634 of the second reconfigurable amplifier 630 are both coupled to the output 616 of the amplifying circuit 610.

In certain aspects, the first reconfigurable amplifier 620 is configured to receive a first signal via the first input 612 of the amplifying circuit 610, amplify the first signal, and output the amplified first signal to the output 616 of the amplifying circuit 610. The second reconfigurable amplifier 630 is configured to receive a second signal via the second input 614 of the amplifying circuit 610, amplify the second signal, and output the amplified second signal to the output 616 of the amplifying circuit 610.

In certain aspects, the controller 260 may configure the amplifying circuit 610 to operate in a combining mode or a multiplexing mode. In the combining mode, the controller 260 is configured to place each of the first reconfigurable amplifier 620 and the second reconfigurable amplifier 630 in the cascode mode (e.g., in the manner illustrated in FIG. 2B, 3B, or 4B). In the combining mode, the amplifying circuit 610 may simultaneously receive the first signal at the first input 612 and the second signal at the second input 614, in which the first signal and the second signal are amplified by the first reconfigurable amplifier 620 and the second reconfigurable amplifier 630, respectively, and combined at the output 616 of the amplifying circuit 610.

Thus, in the combining mode, both the first reconfigurable amplifier 620 and the second reconfigurable amplifier 630 operate in the cascode mode. Operating both the first reconfigurable amplifier 620 and the second reconfigurable amplifier 630 in the cascode mode mitigates the loading effect in the combining mode. This is because each of the first reconfigurable amplifier 620 and the second reconfigurable amplifier 630 has a high output impedance in the cascode mode. The high output impedance of the first reconfigurable amplifier 620 in the cascode mode reduces the loading effect on the second reconfigurable amplifier 630, and the high output impedance of the second reconfigurable amplifier 630 in the cascode mode reduces the loading effect on the first reconfigurable amplifier 620.

In the multiplexing mode, the controller 260 is configured to place one of the first reconfigurable amplifier 620 and the second reconfigurable amplifier 630 in the non-cascode mode (e.g., in the manner illustrated in FIG. 2C, 3C, or 4C) and turn off the other one of the first reconfigurable amplifier 620 and the second reconfigurable amplifier 630. The multiplexing mode may include a first multiplexing mode and a second multiplexing mode. In the first multiplexing mode, the controller 260 is configured to place the first reconfigurable amplifier 620 in the non-cascode mode and turn off the second reconfigurable amplifier 630. In the second multiplexing mode, the controller 260 is configured to place the second reconfigurable amplifier 630 in the non-cascode mode and turn off the first reconfigurable amplifier 620.

In the first multiplexing mode, the first reconfigurable amplifier 620 amplifies the first signal in the non-cascode mode, and outputs the amplified first signal to the output 616 of the amplifying circuit 610. Operating the first reconfigurable amplifier 620 in the non-cascode mode improves power efficiency in the first multiplexing mode.

In the second multiplexing mode, the second reconfigurable amplifier 630 amplifies the second signal in the non-cascode mode, and outputs the amplified second signal to the output 616 of the amplifying circuit 610. Operating the second reconfigurable amplifier 630 in the non-cascode mode improves power efficiency in the second multiplexing mode.

It is to be appreciated that the exemplary amplifying circuit 610 is not limited to the first reconfigurable amplifier 620 and the second reconfigurable amplifier 630. For example, in some implementations, the amplifying circuit 610 may include one or more additional reconfigurable amplifiers coupled to the output 616.

It is also to be appreciated that, in some implementations, the amplifying circuit 610 may not support both the first multiplexing mode and the second multiplexing mode. For example, in some implementations, the amplifying circuit 610 may support the first multiplexing mode but not the second multiplexing mode. In this example, the second reconfigurable amplifier 630 may be replaced with a cascode amplifier that does not support a non-cascode mode since the second multiplexing mode is not supported in this example. In this example, the controller 260 is configured to place the first reconfigurable amplifier 620 in the cascode mode and turn on the cascode amplifier in the combining mode, and to place the first reconfigurable amplifier 620 in the non-cascode mode and turn off the cascode amplifier in the first multiplexing mode.

Figure 7:
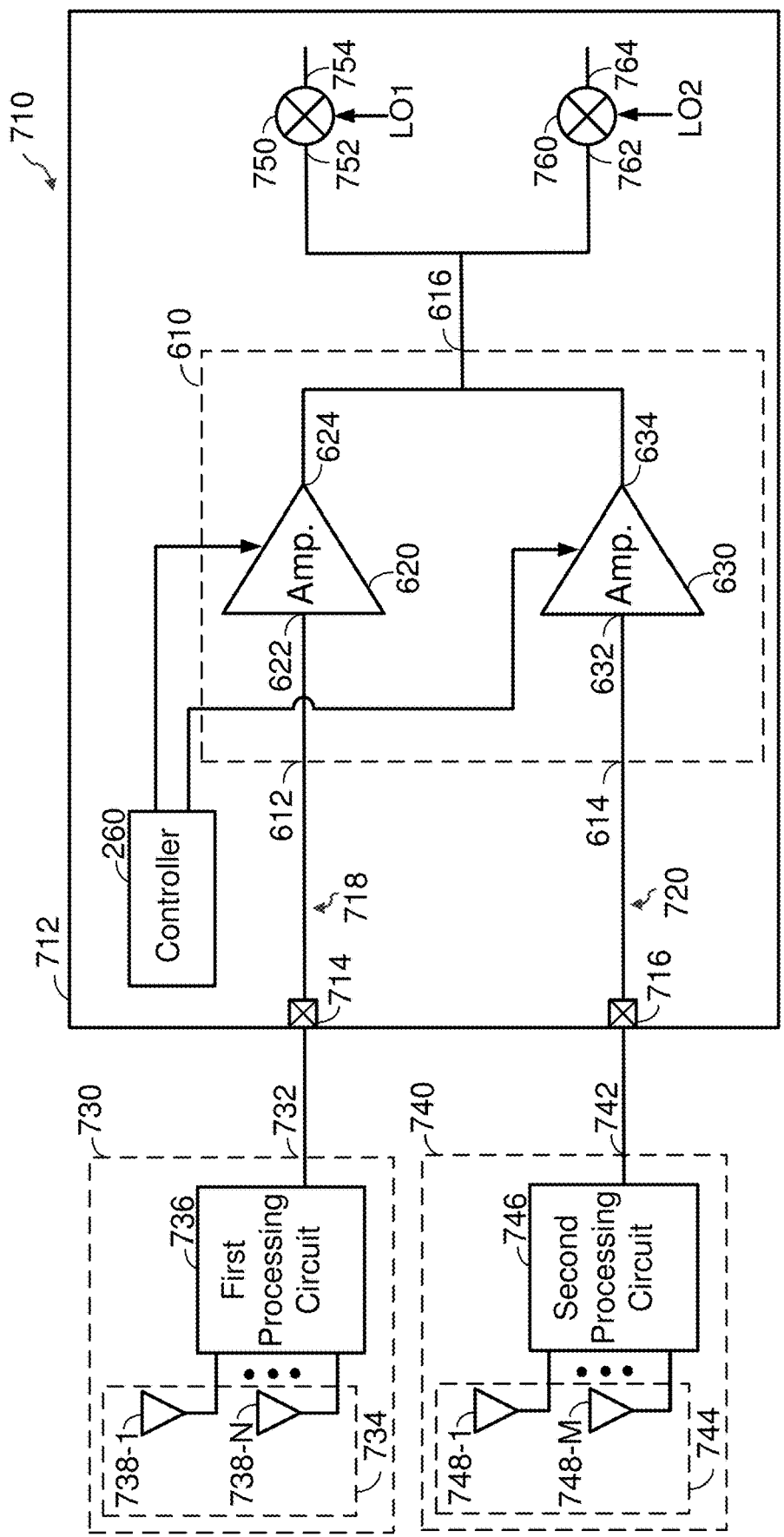
FIG. 7 shows an example of a wireless device including the reconfigurable amplifying circuit according to certain aspects of the present disclosure.

FIG. 7 shows an example of a wireless device 710 including the amplifying circuit 610 and the controller 260 according to certain aspects. In this example, the wireless device 710 also includes a first pad 714, a second pad 716, a first module 730, and a second module 740. The first pad 714 is coupled to the first input 612 of the amplifying circuit 610, and the second pad 716 is coupled to the second input 614 of the amplifying circuit 610. In one example, the amplifying circuit 610, the first pad 714, and the second pad 716 are integrated on a chip 712 (i.e., die), and the first module 730 and the second module 740 are off chip. In the example shown in FIG. 7, the first pad 714 is coupled to an output 732 of the first module 730 (via a respective metal trace on a printed circuit board or another type of transmission line), and the second pad 716 is coupled to an output 742 of the second module 740 (via a respective metal trace on a printed circuit board or another type of transmission line). It is to be appreciated that a pad may also be referred to as a port, a pin, or another term.

In the example shown in FIG. 7, the wireless device 710 includes a first receive path 718 between the first pad 714 and the output 616 of the amplifying circuit 610, in which the first receive path 718 includes the first reconfigurable amplifier 620. Also, in this example, the wireless device 710 also includes a second receive path 720 between the second pad 716 and the output 616 of the amplifying circuit 610, in which the second receive path 720 includes the second reconfigurable amplifier 630. In this example, the first receive path 718 and the second receive path 720 are coupled to a common output (i.e., the output 616). The input of the first receive path 718 is coupled to the output 732 of the first module 730 via the first pad 714, and the input of the second receive path 720 is coupled to the output 742 of the second module 740 via the second pad 716. It is to be appreciated that each of the first receive path 718 and the second receive path 720 may include one or more additional elements not shown in FIG. 7 (e.g., an impedance matching circuit, an electrostatic discharge (ESD) protection circuit, a filter, etc.).

In the example shown in FIG. 7, the first module 730 incudes a first antenna array 734 and a first processing circuit 736. The first antenna array 734 includes antennas 738-1 to 738-N coupled to the first processing circuit 736. The antennas 738-1 to 738-N may be mounted on or integrated on a common substrate, and each of the antennas 738-1 to 738-N may include a patch antenna or another type of antenna. In one example, the first processing circuit 736 is configured to receive a first radio frequency (RF) signal and a second RF signal via the first antenna array 734, process the first RF signal into a first IF signal, and process the second RF signal into a second IF signal. The first processing circuit 736 is configured to output the first IF signal and the second IF signal at the output 732 of the first module 730 either simultaneously or individually, as discussed further below. The first processing circuit 736 may include one or more mixers (not shown) for frequency down-converting the first RF signal into the first IF signal and frequency down-converting the second RF signal into the second IF signal. The first processing circuit 736 may further include other transceiver circuitry for processing and/or conditioning the RF signals such as phase shifters, amplifiers, filtering circuits, and the like.

In this example, the second module 740 incudes a second antenna array 744 and a second processing circuit 746. The second antenna array 744 includes antennas 748-1 to 748-M coupled to the second processing circuit 746. The antennas 748-1 to 748-M may be mounted on or integrated on a common substrate, and each of the antennas 748-1 to 748-M may include a patch antenna or another type of antenna. It is to be appreciated that the number of antennas 738-1 to 738-N in the first antenna array 734 and the number of antennas 748-1 to 748-M in the second antenna array 744 may be the same or different. In one example, the second processing circuit 746 is configured to receive the RF signal and the second RF signal via the second antenna array 744, process the first RF signal into a third IF signal, and process the second RF signal into a fourth IF signal. The second processing circuit 746 is configured to output the third IF signal and the fourth IF signal at the output 742 of the second module 740 either simultaneously or individually, as discussed further below. The second processing circuit 746 may include one or more mixers (not shown) for frequency down-converting the first RF signal into the third IF signal and frequency down-converting the second RF signal into the fourth IF signal. The second processing circuit 746 may further include other transceiver circuitry for processing and/or conditioning the RF signals such as phase shifters, amplifiers, filtering circuits, and the like.

In one example, the first IF signal output by the first module 730 and the third IF signal output by the second module 740 may have approximately the same intermediate frequency (IF). The second IF signal output by the first module 730 and the fourth IF signal output by the second module 740 may have approximately the same intermediate frequency (IF).

In certain aspects, the first module 730 may be configured to receive signals in a first receive direction (e.g., receive beam direction) and the second module 740 may be configured to receive signals in a second receive direction (e.g., receive beam direction). For example, the antennas 738-1 to 738-N of the first module 730 and the antennas 748-1 to 748-M of the second module 740 may point in different directions. In these aspects, the wireless device 710 may switch reception of the first RF signal between the first receive direction and the second receive direction by switching between the first module 730 and the second module 740 to receive the first RF signal. Similarly, the wireless device 710 may switch reception of the second RF signal between the first receive direction and the second receive direction by switching between the first module 730 and the second module 740 to receive the second RF signal. The first receive direction may be steerable or fixed relative to the wireless device 710, and the second receive direction may be steerable or fixed relative to the wireless device 710.

Similarly, the first module 730 and the second module 740 may be placed on different locations of the wireless device 710 where the antenna directionality between the modules 730 and 740 may be the same or different and/or where the characteristics of RF signals received may be different between the first module 730 and the second module 740. In this example, the wireless device 710 may switch between the different antenna directionalities and/or between the different RF signal characteristics by switching between the first module 730 and the second module 740 in a similar manner.

In certain aspects, the first RF signal and the second RF signal may be in a mmWave band (e.g., above 24 GHZ). Operating in the mmWave band allows increased bandwidth and the use of small antennas, which reduces the size of the first antenna array 734 and the second antenna array 744, allowing the first antenna array 734 and the second antenna array 744 to be incorporated into the wireless device 710. However, it is to be appreciated that the present disclosure is not limited to the mmWave band.

In certain aspects, the first RF signal and the second RF signal are in different frequency bands in the mm Wave band. For example, the first RF signal may be in a first frequency band in the mm Wave band and the second RF signal may be in a second frequency band in the mmWave band. In one example, the second frequency band may be higher than the first frequency band (i.e., the lowest frequency in the second frequency band is higher than the highest frequency in the first frequency band). In this example, the first frequency band may be referred to as a low band ("LB") and the second frequency band may be referred to as the high band ("HB").

In certain aspects, the wireless device 710 may employ carrier aggregation (CA) in which the wireless device 710 simultaneously receives data using multiple carriers (also referred to as component carriers). In one example, one or more of the carriers may be in the first frequency band and one or more other ones of the carriers may be in the second frequency band. In this example, the wireless device 710 may receive data using CA in a CA mode. In the CA mode, the wireless device 710 simultaneously receives data in first frequency band (e.g., HB) using the first RF signal and data in the second frequency band (e.g., LB) using the second RF signal. In the CA mode, the wireless device 710 may operate in any one of several different beam modes, as discussed further below.

In a first beam mode in the CA mode, the wireless device 710 receives both the first RF signal corresponding to the first frequency band (e.g., LB) and the second RF signal corresponding to the second frequency band (e.g., HB) using the first module 730. In this case, the first module 730 outputs the first IF signal corresponding to the first RF signal and the second IF signal corresponding to the second RF signal to the first reconfigurable amplifier 620. Thus, in the first beam mode mode, the first receive path 718 (which includes the first reconfigurable amplifier 620) simultaneously receives the first IF signal and the second IF signal. In this case, the first signal input to the first reconfigurable amplifier 620 discussed above includes the first IF signal and the second IF signal.

In a second beam mode in the CA mode, the wireless device 710 receives both the first RF signal corresponding to the first frequency band (e.g., LB) and the second RF signal corresponding to the second frequency band (e.g., HB) using the second module 740. In this case, the second module 740 outputs the third IF signal corresponding to the first RF signal and the fourth IF signal corresponding to the second RF signal to the second reconfigurable amplifier 630. Thus, in the second beam mode, the second receive path 720 (which includes the second reconfigurable amplifier 630) simultaneously receives the first IF signal and the second IF signal. In this case, the second signal input to the second reconfigurable amplifier 630 discussed above includes the third IF signal and the fourth IF signal.

In a third beam mode in the CA mode, the wireless device 710 receives the first RF signal corresponding to the first frequency band (e.g., LB) using the first module 730 and receives the second RF signal corresponding to the second frequency band (e.g., HB) using the second module 740. In this case, the first module 730 outputs the first IF signal corresponding to the first RF signal to the first reconfigurable amplifier 620, and the second module 740 outputs the fourth IF signal corresponding to the second RF signal to the second reconfigurable amplifier 630. Thus, in the third beam mode, the first receive path 718 (which includes the first reconfigurable amplifier 620) receives the first IF signal and second receive path 720 (which includes the second reconfigurable amplifier 630) receives the fourth IF signal.

In a fourth beam mode in the CA mode, the wireless device 710 receives the first RF signal corresponding to the first frequency band (e.g., LB) using the second module 740 and receives the second RF signal corresponding to the second frequency band (e.g., HB) using the first module 730. In this case, the first module 730 outputs the second IF signal corresponding to the second RF signal to the first reconfigurable amplifier 620, and the second module 740 outputs the third IF signal corresponding to the first RF signal to the second reconfigurable amplifier 630. Thus, in the fourth beam mode, the first receive path 718 (which includes the first reconfigurable amplifier 620) receives the second IF signal and second receive path 720 (which includes the second reconfigurable amplifier 630) receives the third IF signal.

Thus, in the CA mode, the first receive path 718 (which includes the first reconfigurable amplifier 620) receives the first IF signal and the second IF signal either simultaneously or individually from the first module 730 depending on which one of the first beam mode, the third beam mode, and the fourth beam mode is being used. Also, in the CA mode, the second receive path 720 (which includes the second reconfigurable amplifier 630) receives the third IF signal and the fourth IF signal either simultaneously or individually from the second module 740 depending on which one of the second beam mode, the third beam mode, and the fourth beam mode is being used.

In certain aspects, the wireless device 710 may employ beam switching by switching between two or more of the beam modes discussed above. For instance, in one example, the wireless device 710 may receive both the first RF signal and the second RF signal in the first beam mode using the first module 730 but then switch from the first beam mode to the fourth beam mode or switch from the first beam mode to the third beam mode.

In these aspects, the wireless device 710 may employ beam switching depending on the best signal quality or strength (e.g., based on direction or other factors such as those based on the location of each of the first module 730 and the second module 740) for the first RF signal corresponding to the first frequency band and the signal quality or strength (e.g., based on direction or other factors) for the second RF signal corresponding to the second frequency band. For example, when the best direction or quality for the first RF signal changes, the wireless device 710 may switch between modules 730 and 740 (e.g., by switching the wireless device 710 from the first beam mode to the fourth beam mode). The best direction or signal strength for the first RF signal may change, for example, due to changes in the orientation of the wireless device 710, changes in the position of the device transmitting the first RF signal, etc. Similarly, the best direction or quality for the second RF signal may change, for example, due to changes in the orientation of the wireless device 710, changes in the position of the device transmitting the second RF signal, etc. The first RF signal and the second RF signal may be transmitted from the same device or different devices.

In the CA mode, the controller 260 may operate the amplifying circuit 610 in the combining mode. Thus, in the CA mode, both the first reconfigurable amplifier 620 and the second reconfigurable amplifier 630 are turned on (e.g., both are activated) in the cascode mode. This may be done, for example, to provide seamless beam switching in the CA mode. For example, when the first RF signal and the second RF signal are received in the first beam mode, the first reconfigurable amplifier 620 may simultaneously receive the first IF signal and the second IF signal from the first module 730. In this example, the second reconfigurable amplifier 630 is turned on in the first beam mode in the CA mode (even while not necessarily receiving a signal) to provide seamless beam switching when switching to receiving one of the first RF signal or the second RF signal from the first module 730 to the second module 740. In another example, when the first RF signal and the second RF signal are received in the second beam mode, the second reconfigurable amplifier 630 may simultaneously receive the third IF signal and the fourth IF signal from the second module 740. In this example, the first reconfigurable amplifier 620 is turned on in the second beam mode in the CA mode to provide seamless beam switching when switching to receiving one of the first RF signal or the second RF signal from the second module 740 to the first module 730.

The controller 260 may operate the amplifying circuit 610 in the multiplexing mode when the wireless device 710 receives one of the first RF signal corresponding to the first frequency band (e.g., LB) and the second RF signal corresponding to the second frequency band (e.g., HB), but not both (e.g., single band mode). For example, when the wireless device 710 receives the first RF signal or the second RF signal using the first module 730, the controller 260 may operate the amplifying circuit 610 in the first multiplexing mode. In this example, the first reconfigurable amplifier 620 receives the first IF signal or the second IF signal from the first module 730. When the wireless device 710 receives the first RF signal or the second RF signal using the second module 740, the controller 260 may operate the amplifying circuit 610 in the second multiplexing mode. In this example, the second reconfigurable amplifier 630 receives the third IF signal or the fourth IF signal from the second module 740. Thus, the controller 260 may operate the amplifying circuit 610 in the combining mode when the wireless device 710 is in the CA mode, and operate the amplifying circuit 610 in the multiplexing mode in a single band mode.

In the example shown in FIG. 7, the wireless device 710 further includes a first mixer 750 and a second mixer 760. The first mixer 750 has an input 752 coupled to the output 616 of the amplifying circuit 610 and an output 754. The first mixer 750 is configured to frequency down-convert the amplified first IF signal from the first reconfigurable amplifier 620 (e.g., to baseband) or frequency down-convert the amplified third IF signal from the second reconfigurable amplifier 630 (i.e., to baseband). The first mixer 750 may do this by mixing the first IF signal or the third IF signal with a first local oscillator signal LO1. The output 754 of the first mixer 750 may be coupled to a processor (e.g., baseband processor) for further processing (e.g., demodulation, decoding, filtering, etc.).

The second mixer 760 has an input 762 coupled to the output 616 of the amplifying circuit 610 and an output 764. The second mixer 760 is configured to frequency down-convert the amplified second IF signal from the first reconfigurable amplifier 620 (e.g., to baseband) or frequency down-convert the amplified fourth IF signal from the second reconfigurable amplifier 630 (e.g., to baseband). The second mixer 760 may do this by mixing the second IF signal or the fourth IF signal with a second local oscillator signal LO2. The output 764 of the second mixer 760 may be coupled to a processor (e.g., baseband processor) for further processing (e.g., demodulation, decoding, filtering, etc.).

For example, when the first RF signal and the second RF signal are received using the first module 730, the first IF signal and the second IF signal from the first module 730 are amplified together by the first reconfigurable amplifier 620, and the first IF signal and the second IF signal are frequency down-converted separately by the first mixer 750 and the second mixer 760, respectively. In another example, when the first RF signal is received using the first module 730 and the second RF signal is received using the second module 740, the first IF signal from the first module 730 and the fourth IF signal from the second module 740 are amplified separately by the first reconfigurable amplifier 620 and the second reconfigurable amplifier 630, respectively, and the first IF signal and the fourth IF signal are frequency down-converted separately by the first mixer 750 and the second mixer 760, respectively.

It is to be appreciated that the wireless device 710 may include additional components not shown in FIG. 7. For example, in some implementations, the wireless device 710 may include a first filter (not shown) or another frequency-selective component between the output 616 and the first mixer 750 configured to pass the first IF signal and the third IF signal to the first mixer 750 while blocking the second IF signal and the fourth IF signal. The wireless device 710 may include a second filter (not shown) or another frequency-selective component between the output 616 and the second mixer 760 configured to pass the second IF signal and the fourth IF signal to the second mixer 760 while blocking the first IF signal and the third IF signal.

In addition, the wireless device 710 may include additional modules and accompanying reconfigurable amplifiers in addition to the first module 730 and the second module 740. In just one example, the wireless device 710 may include 2 or 4 modules each associated with a common direction (e.g., first direction) where each module is coupled to a respective reconfigurable amplifier. In addition to these 2 or 4 modules, in an example the wireless device 710 may include an additional 2 or 4 modules each associated with another antenna direction (e.g., second direction) where each module is coupled to a respective reconfigurable amplifier. Other configurations are also possible with more or fewer modules. In these examples, additional down-conversion paths with other mixers may be provided to downconvert to baseband signals for further processing when additional modules are present.

Figure 8:
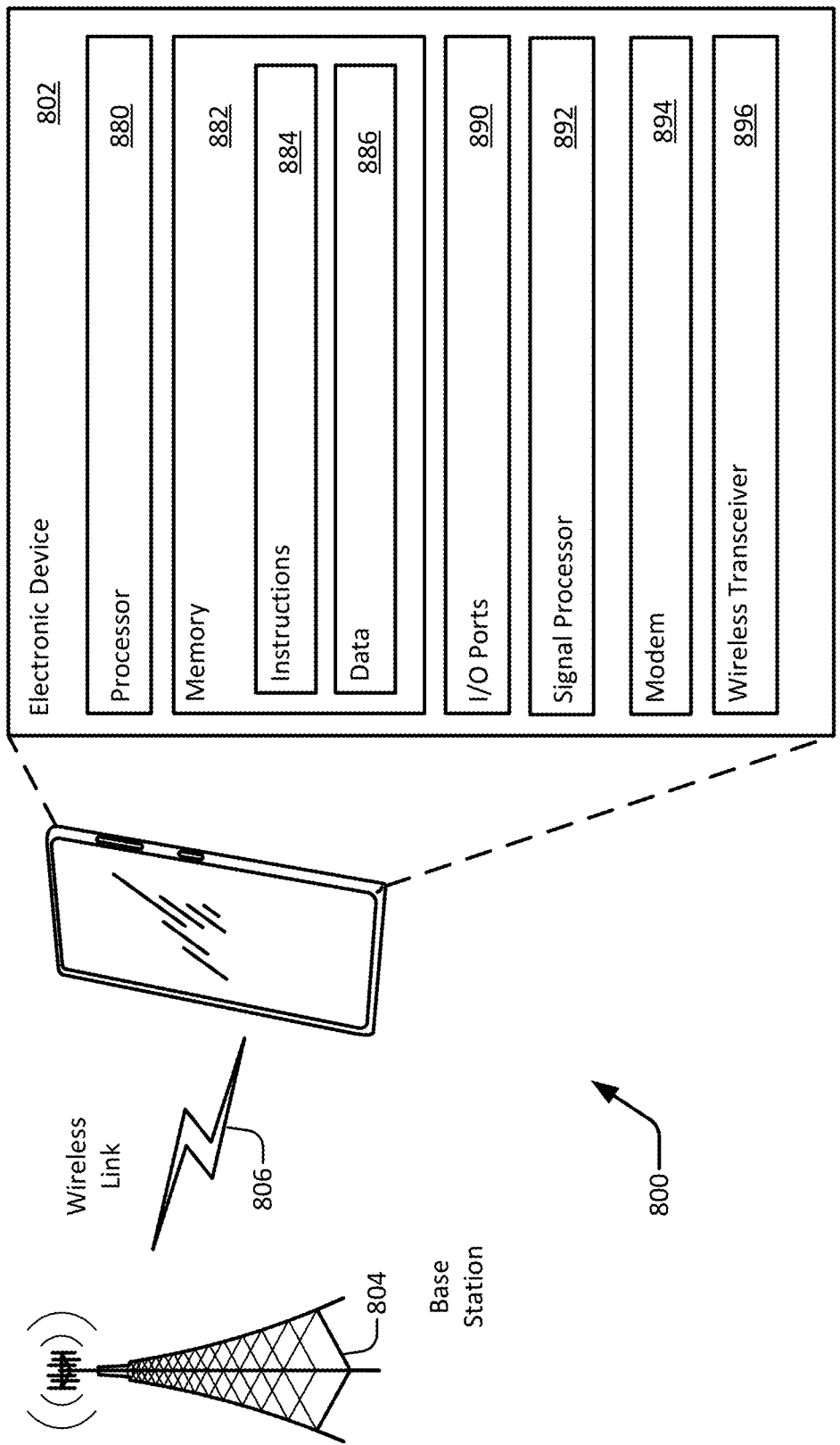
FIG. 8 is a diagram of an environment including an electronic device that includes a transceiver according to certain aspects of the present disclosure.

FIG. 8 is a diagram of an environment 800 that includes an electronic device 802 and a base station 804. The electronic device 802 may correspond to the wireless device 710. The electronic device 802 includes a wireless transceiver 896, which may include the exemplary amplifying circuit 610, the first module 730, the second module 740, the first mixer 750, and/or the second mixer 760.

In the environment 800, the electronic device 802 communicates with the base station 804 through a wireless link 806. As shown, the electronic device 802 is depicted as a smart phone. However, the electronic device 802 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 804 communicates with the electronic device 802 via the wireless link 806, which may be implemented as any suitable type of wireless link. Although depicted as a base station tower of a cellular radio network, the base station 804 may represent or be implemented as another device, such as a satellite, terrestrial broadcast tower, access point, peer to peer device, mesh network node, fiber optic line, another electronic device generally as described above, and so forth. Hence, the electronic device 802 may communicate with the base station 804 or another device via a wired connection, a wireless connection, or a combination thereof. The wireless link 806 can include a downlink of data or control information communicated from the base station 804 to the electronic device 802 and an uplink of other data or control information communicated from the electronic device 802 to the base station 804. The wireless link 806 may be implemented using any suitable communication protocol or standard, such as 3rd Generation Partnership Project Long-Term Evolution (3GPP LTE, 3GPP NR 5G), IEEE 802.11, IEEE 802.11, Bluetooth™, and so forth.

The electronic device 802 includes a processor 880 and a memory 882. The memory 882 may be or form a portion of a computer readable storage medium. The processor 880 may include any type of processor, such as an application processor or a multi-core processor, that is configured to execute processor-executable instructions (e.g., code) stored by the memory 882. The memory 882 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 882 is implemented to store instructions 884, data 886, and other information of the electronic device 802. The processor may perform one or more of the exemplary operations of the controller 260 discussed above according to various aspects.

The electronic device 1102 may also include input/output (I/O) ports 890. The I/O ports 890 enable data exchanges or interaction with other devices, networks, or users or between components of the device.

The electronic device 802 may further include a signal processor (SP) 892 (e.g., such as a digital signal processor (DSP)). The signal processor 892 may function similar to the processor 880 and may be capable of executing instructions and/or processing information in conjunction with the memory 882.

For communication purposes, the electronic device 802 also includes a modem 894, the wireless transceiver 896, and one or more antennas (e.g., the antennas 738-1 to 738-N and/or antennas 748-1 to 748-M). The wireless transceiver 896 provides connectivity to respective networks and other electronic devices connected therewith using RF wireless signals. The wireless transceiver 896 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

Figure 9:
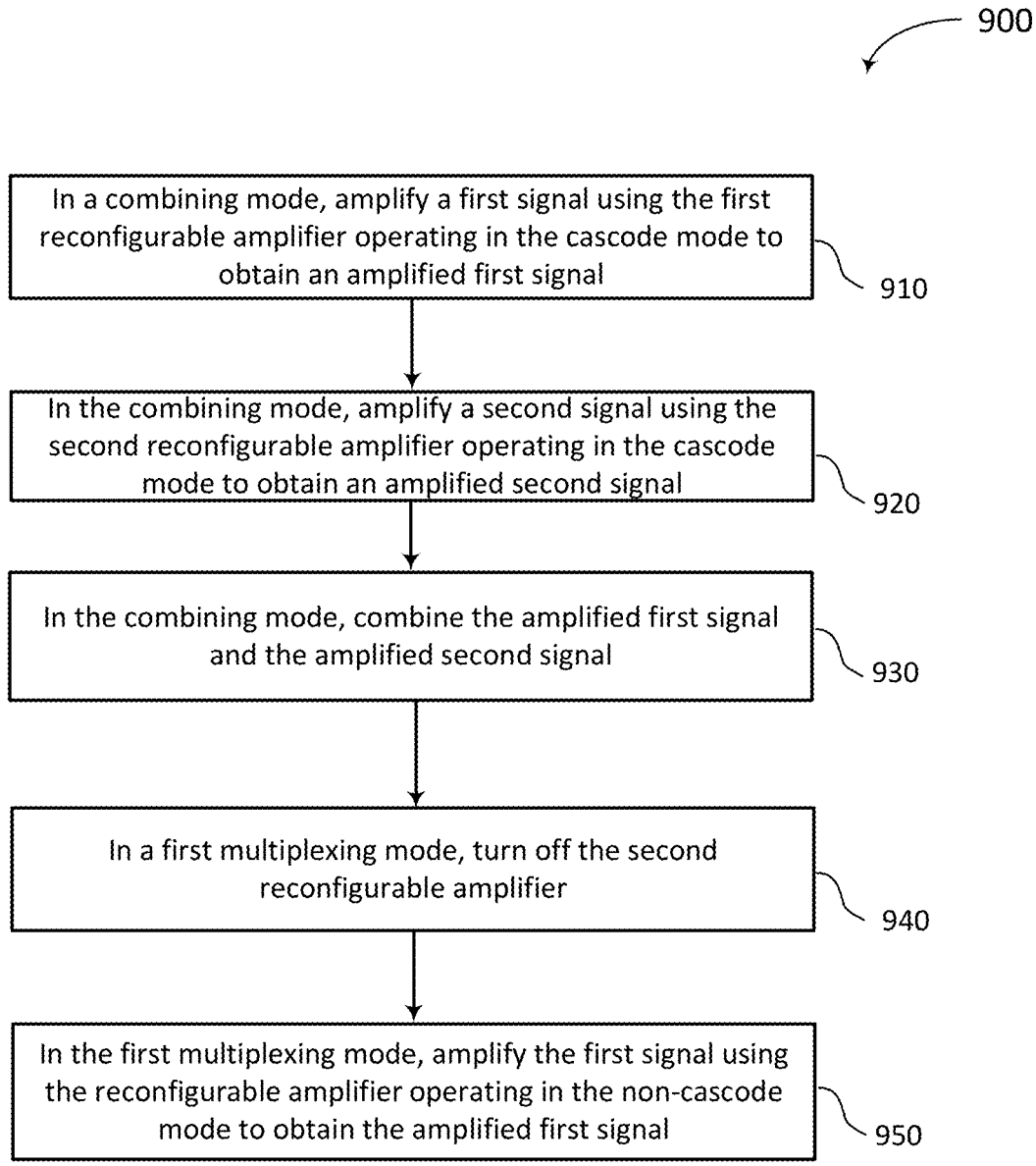
FIG. 9 shows a flowchart illustrating a method for amplification according to certain aspects of the present disclosure.

FIG. 9 illustrates a method 900 of amplification using a first reconfigurable amplifier (e.g., the first reconfigurable amplifier 620) and a second reconfigurable amplifier (e.g., the second reconfigurable amplifier 630) according to certain aspects. Each of the first reconfigurable amplifier and the second reconfigurable amplifier is configured to selectively operate in a cascode mode or a non-cascode mode.

At block 910, in a combining mode, a first signal is amplified using the first reconfigurable amplifier operating in the cascode mode to obtain an amplified first signal. In certain aspects, the first signal may correspond to the first RF signal in the first frequency band.

At block 920, in the combining mode, a second signal is amplified using the second reconfigurable amplifier operating in the cascode mode to obtain an amplified second signal. In certain aspects, the second signal may correspond to the second RF signal in the second frequency band.

At block 930, in the combining mode, the amplified first signal and the amplified second signal are combined. For example, the amplified first signal and the amplified second signal may be combined at the output 616 of the amplifying circuit 610.

At block 940, in a first multiplexing mode, the second reconfigurable amplifier is turned off. For example, the second reconfigurable amplifier may be turned off by the controller 260.

At block 950, in the first multiplexing mode, the first signal is amplified using the first reconfigurable amplifier operating in the non-cascode mode to obtain the amplified first signal.

The method 900 may also include, in a second multiplexing mode, turning off the first reconfigurable amplifier, and amplifying the second signal using second reconfigurable amplifier operating in the non-cascode mode to obtain the amplified second signal. For example, the first reconfigurable amplifier may be turned off by the controller 260.

The controller 260 may be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Implementation examples are described in the following numbered clauses:

1. An apparatus, comprising:
   a reconfigurable amplifier, comprising:
   a first transistor having a gate coupled to an input of the reconfigurable amplifier, and a source coupled to a ground;
   a gate control circuit;
   a second transistor having a gate coupled to the gate control circuit, a source coupled to a drain of the first transistor, and a drain coupled to an output of the reconfigurable amplifier, wherein the gate control circuit is configured to output a bias voltage to the gate of the second transistor in a cascode mode, and output a switch voltage to the gate of the second transistor in a non-cascode mode; and
   a load coupled to the output of the reconfigurable amplifier.
2. The apparatus of clause 1, wherein:
   the bias voltage biases the second transistor in a saturation region; and
   the switch voltage biases the second transistor in a triode region.
3. The apparatus of clause 2, further comprising a supply control circuit, wherein the load is coupled between the supply control circuit and the output of the reconfigurable amplifier.
4. The apparatus of clause 3, wherein the supply control circuit is configured to:
   output a first supply voltage to the load in the cascode mode; and
   output a second supply voltage to the load in the non-cascode mode;
   wherein the first supply voltage is higher than the second supply voltage.
5. The apparatus of clause 4, wherein the switch voltage is approximately equal to the second supply voltage.
6. The apparatus of any one of clauses 1 to 5, further comprising a bias circuit, and wherein the gate control circuit comprises:
   a resistor;
   a first switch coupled between the resistor and the bias circuit, wherein the resistor is coupled between the first switch and the gate of the second transistor; and
   a second switch coupled between the resistor and the switch voltage, wherein the resistor is coupled between the second switch and the gate of the second transistor.
7. The apparatus of clause 6, wherein:
   the bias circuit is configured to output the bias voltage, the bias voltage biasing the second transistor in a saturation region; and
   the switch voltage biases the second transistor in a triode region.
8. The apparatus of clause 6 or 7, further comprising a controller configured to:
   turn on the first switch and turn off the second switch in the cascode mode; and
   turn off the first switch and turn on the second switch in the non-cascode mode.
9. The apparatus of any one of clauses 6 to 8, wherein the gate control circuit further comprises:
   a third switch; and
   a capacitor, wherein the third switch is coupled between the capacitor and the ground, and the capacitor is coupled between the third switch and the gate of the second transistor.
10. The apparatus of clause 9, further comprising a controller configured to:
    turn on the first switch, turn off the second switch, and turn on the third switch in the cascode mode; and
    turn off the first switch, turn on the second switch, and turn off the third switch in the non-cascode mode.
11. The apparatus of clause 10, further comprising:
    a fourth switch coupled between a first supply rail and the load; and
    a fifth switch coupled between a second supply rail and the load;
    wherein the controller is configured to turn on the fourth switch and turn off the fifth switch in the cascode mode, and turn off the fourth switch and turn on the fifth switch in the non-cascode mode.
12. The apparatus of any one of clauses 1 to 11, wherein the load comprises:
    a third transistor having a gate coupled to an input of the reconfigurable amplifier; and
    a fourth transistor having a gate coupled to the gate control circuit, a source coupled to a drain of the third transistor, and a drain coupled to the output of the reconfigurable amplifier.
13. The apparatus of clause 12, wherein:
    each of the first transistor and the second transistor comprises a respective n-type field effect transistor; and
    each of the third transistor and the fourth transistor comprises a respective p-type field effect transistor.
14. The apparatus of clause 12 or 13, wherein the gate control circuit is configured to output a second bias voltage to the gate of the fourth transistor in the cascode mode, the second bias voltage biasing the fourth transistor in a saturation region.
15. The apparatus of clause 14, wherein the gate control circuit is configured to couple the gate of the fourth transistor to the ground in the non-cascode mode.
16. The apparatus of clause 14 or 15, further comprising a supply control circuit, wherein a source of the third transistor is coupled to the supply control circuit, and the supply control circuit is configured to:
  output a first supply voltage to the source of the third transistor in the cascode mode; and
  output a second supply voltage to the source of the third transistor in the non-cascode mode;
  wherein the first supply voltage is higher than the second supply voltage.
17. The apparatus of clause 16, wherein the switch voltage is approximately equal to the second supply voltage.
18. The apparatus of any one of clauses 1 to 17, further comprising:
  an antenna coupled to the input of the reconfigurable amplifier; and
  a mixer coupled to the output of the reconfigurable amplifier.
19. The apparatus of any one of clauses 1 to 18, wherein the first transistor comprises a first n-type field effect transistor (NFET), and the second transistor comprises a second n-type field effect transistor (NFET).
20. An apparatus, comprising:
  an amplifying circuit, comprising:
    a first reconfigurable amplifier configured to selectively operate in a cascode mode or a non-cascode mode, wherein an input of the first reconfigurable amplifier is coupled to a first input of the amplifying circuit, and an output of the first reconfigurable amplifier is coupled to an output of the amplifying circuit; and
    a second reconfigurable amplifier configured to selectively operate in the cascode mode or the non-cascode mode, wherein an input of the second reconfigurable amplifier is coupled to a second input of the amplifying circuit, and an output of the second reconfigurable amplifier is coupled to the output of the amplifying circuit; and
    a controller coupled to the first reconfigurable amplifier and the second reconfigurable amplifier, wherein the controller is configured to:
    in a combining mode, cause the first reconfigurable amplifier to operate in the cascode mode and the second reconfigurable amplifier to operate in the cascode mode; and
    in a first multiplexing mode, cause the first reconfigurable amplifier to operate in the non-cascode mode and turn off the second reconfigurable amplifier.
21. The apparatus of clause 20, wherein the controller is configured to, in a second multiplexing mode, cause the second reconfigurable amplifier to operate in the non-cascode mode and turn off the first reconfigurable amplifier.
22. The apparatus of clause 20 or 21, further comprising:
  a first mixer coupled to the output of the amplifying circuit; and
  a second mixer coupled to the output of the amplifying circuit.
23. A method of amplification using a first reconfigurable amplifier and a second reconfigurable amplifier, wherein each of the first reconfigurable amplifier and the second reconfigurable amplifier is configured to selectively operate in a cascode mode or a non-cascode mode, the method comprising:
  in a combining mode,
    amplifying a first signal using the first reconfigurable amplifier operating in the cascode mode to obtain an amplified first signal;
    amplifying a second signal using the second reconfigurable amplifier operating in the cascode mode to obtain an amplified second signal; and
    combining the amplified first signal and the amplified second signal; and
  in a first multiplexing mode;
    turning off the second reconfigurable amplifier; and
    amplifying the first signal using the first reconfigurable amplifier operating in the non-cascode mode to obtain the amplified first signal.
24. The method of clause 23, further comprising:
  in a second multiplexing mode,
    turning off the first reconfigurable amplifier; and
    amplifying the second signal using second reconfigurable amplifier operating in the non-cascode mode to obtain the amplified second signal.
25. The method of clause 23 or 24, further comprising:
  in the combining mode,
    receiving the first signal via a first antenna; and
    receiving the second signal via a second antenna.
26. The method of clause 25, further comprising:
  in the combining mode,
    mixing the amplified first signal with a first local oscillator signal; and
    mixing the amplified second signal with a second local oscillator signal, the second local oscillator signal having a different frequency than the first local oscillator signal.
27. An apparatus, comprising:
  a first receive path including a first reconfigurable amplifier configured to selectively operate in a cascode mode or a non-cascode mode, the first receive path having an input configured to receive a first intermediate frequency (IF) signal corresponding to a first radio frequency (RF) signal and a second IF signal corresponding to a second RF signal either simultaneously or individually;
  a second receive path including a second reconfigurable amplifier configured to selectively operate in the cascode mode or the non-cascode mode, the second receive path having an input configured to receive a third IF signal corresponding to the first RF signal and a fourth IF signal corresponding to the second RF signal either simultaneously or individually, wherein the first receive path and the second receive path have a common output;
  a first mixer coupled to the common output, wherein the first mixer is configured to frequency down-convert the first IF signal and the third IF signal; and
  a second mixer coupled to the common output, wherein the second mixer is configured to frequency down-convert the second IF signal and the fourth IF signal.
28. The apparatus of clause 27, further comprising a controller configured to cause both the first reconfigurable amplifier and the second reconfigurable amplifier to operate in the cascode mode in a carrier aggregation (CA) mode.
29. The apparatus of clause 28, wherein the second reconfigurable amplifier is active when the first reconfigurable amplifier simultaneously receives the first IF signal and the second IF signal in the CA mode.
30. The apparatus of clause 29, wherein first reconfigurable amplifier is active when the second reconfigurable amplifier simultaneously receives the third IF signal and the fourth IF signal in the CA mode.
31. The apparatus of any one of clauses 28 to 30, wherein the controller is configured to cause the first reconfigurable amplifier to operate in the non-cascode mode and turn off the second reconfigurable amplifier in a first multiplexing mode.
32. The apparatus of clause 31, wherein the controller is configured to cause the second reconfigurable amplifier to operate in the non-cascode mode and turn off the first reconfigurable amplifier in a second multiplexing mode.

33. The apparatus of any one of clauses 27 to 32, further comprising:
a first module coupled to the input of the first receive path, the first module comprising:
first antennas; and
a first processing circuit configured to receive the first RF signal and the second RF signal via the first antennas, convert the first RF signal into the first IF signal, and convert the second RF signal into the second IF signal.

34. The apparatus of clause 33, further comprising:
a second module coupled to the input of the second receive path, the second module comprising:
second antennas; and
a second processing circuit configured to receive the first RF signal and the second RF signal via the second antennas, convert the first RF signal into the third IF signal, and convert the second RF signal into the fourth IF signal.

35. The apparatus of clause 34, wherein the first antennas and the second antennas are orientated in different directions.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. As used herein, the term "approximately" means within 90% to 110% of the stated value. For example, the switch voltage being approximately equal to the second supply voltage Vdd_lo means that the switch voltage is within 90% to 110% of the second supply voltage Vdd_lo.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
a first receive path including a first reconfigurable amplifier configured to selectively operate in a cascode mode or a non-cascode mode, the first receive path having an input configured to receive a first intermediate frequency (IF) signal corresponding to a first radio frequency (RF) signal and a second IF signal corresponding to a second RF signal either simultaneously or individually;
a second receive path including a second reconfigurable amplifier configured to selectively operate in the cascode mode or the non-cascode mode, the second receive path having an input configured to receive a third IF signal corresponding to the first RF signal and a fourth IF signal corresponding to the second RF signal either simultaneously or individually, wherein the first receive path and the second receive path have a common output;
a first mixer coupled to the common output, wherein the first mixer is configured to frequency down-convert the first IF signal and the third IF signal; and
a second mixer coupled to the common output, wherein the second mixer is configured to frequency down-convert the second IF signal and the fourth IF signal.

2. The apparatus of claim 1, further comprising a controller configured to cause both the first reconfigurable amplifier and the second reconfigurable amplifier to operate in the cascode mode in a carrier aggregation (CA) mode.

3. The apparatus of claim 2, wherein the second reconfigurable amplifier is active when the first reconfigurable amplifier simultaneously receives the first IF signal and the second IF signal in the CA mode.

4. The apparatus of claim 3, wherein the first reconfigurable amplifier is active when the second reconfigurable amplifier simultaneously receives the third IF signal and the fourth IF signal in the CA mode.

5. The apparatus of claim 2, wherein the controller is configured to cause the first reconfigurable amplifier to operate in the non-cascode mode and turn off the second reconfigurable amplifier in a first multiplexing mode.

6. The apparatus of claim 5, wherein the controller is configured to cause the second reconfigurable amplifier to operate in the non-cascode mode and turn off the first reconfigurable amplifier in a second multiplexing mode.

7. The apparatus of claim 1, wherein the first reconfigurable amplifier comprises:
a first transistor having a gate coupled to the input of the first receive path, and a source coupled to a ground;
a second transistor having a source coupled to a drain of the first transistor, and a drain coupled to the common output;
a first load coupled to the common output; and
a first gate control circuit coupled to a gate of the second transistor, wherein the first gate control circuit is configured to:
in the cascode mode, bias the second transistor in a saturation region; and
in the non-cascode mode, bias the second transistor in a triode region.

8. The apparatus of claim 7, wherein the first reconfigurable amplifier further comprises:
a supply control circuit, wherein the first load is coupled between the common output and the supply control circuit, and wherein the supply control circuit is configured to:
output a first supply voltage to the first load in the cascode mode; and
output a second supply voltage to the first load in the non-cascode mode,
wherein the first supply voltage is higher than the second supply voltage.

9. The apparatus of claim 7, wherein the second reconfigurable amplifier comprises:
a third transistor having a gate coupled to the input of the second receive path, and a source coupled to the ground;

a fourth transistor having a source coupled to a drain of
   the third transistor, and a drain coupled to the common
   output;
a second load coupled to the common output; and
a second gate control circuit coupled to a gate of the
   fourth transistor, wherein the second gate control circuit is configured to:
   in the cascode mode, bias the fourth transistor in the
      saturation region; and
   in the non-cascode mode, bias the fourth transistor in
      the triode region.

10. The apparatus of claim 1, further comprising:
a first module coupled to the input of the first receive path,
   the first module comprising:
   first antennas; and
   a first processing circuit configured to receive the first
      RF signal and the second RF signal via the first
      antennas, convert the first RF signal into the first IF
      signal, and convert the second RF signal into the
      second IF signal.

11. The apparatus of claim 10, further comprising:
a second module coupled to the input of the second
   receive path, the second module comprising:
   second antennas; and
   a second processing circuit configured to receive the
      first RF signal and the second RF signal via the
      second antennas, convert the first RF signal into the
      third IF signal, and convert the second RF signal into
      the fourth IF signal.

* * * * *